(12) United States Patent
Takayama et al.

(10) Patent No.: US 7,860,139 B2
(45) Date of Patent: Dec. 28, 2010

(54) SEMICONDUCTOR LASER DEVICE

(75) Inventors: Toru Takayama, Hyogo (JP); Koichi Hayakawa, Okayama (JP); Tomoya Satoh, Osaka (JP); Masatoshi Sasaki, Okayama (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 24 days.

(21) Appl. No.: 12/405,656

(22) Filed: Mar. 17, 2009

(65) Prior Publication Data
US 2009/0296765 A1 Dec. 3, 2009

(30) Foreign Application Priority Data
Jun. 3, 2008 (JP) ............................. 2008-145939

(51) Int. Cl.
*H01S 5/00* (2006.01)
(52) U.S. Cl. ................................ 372/45.01; 372/50.121
(58) Field of Classification Search .............. 372/46.01, 372/45.01, 46.012, 50.1, 50.121
See application file for complete search history.

(56) References Cited

U.S. PATENT DOCUMENTS 6,167,070 A 12/2000 Sakata
6,798,815 B2 * 9/2004 Schmidt et al. ............... 372/64
7,301,979 B2 11/2007 Ito et al.
2006/0098704 A1 * 5/2006 Yamaguchi et al. ...... 372/43.01

FOREIGN PATENT DOCUMENTS

| JP | 08-023133 | 1/1996 |
|---|---|---|
| JP | 10-173277 | 6/1998 |
| JP | 2003-158344 | 5/2003 |
| JP | 2005-064328 | 3/2005 |

* cited by examiner

*Primary Examiner*—Minsun Harvey
*Assistant Examiner*—Patrick Stafford
(74) *Attorney, Agent, or Firm*—McDermott Will & Emery LLP

(57) ABSTRACT

A semiconductor laser device includes an n-type clad layer, an active layer, and a p-type clad layer having a ridge and wing regions. The wing regions are provided with a first trench present on one side of the ridge and a second trench provided on the other side thereof being interposed therebetween. A reflectivity Rf at a front end face of a resonator, a reflectivity Rr at a rear end face of the resonator, a minimum value W1 of a width of the first trench in a region adjacent to the front end face, a minimum value W2 of a width of the second trench in the region adjacent to the front end face, a width W3 of the first trench at the rear end face, and a width W4 of the second trench at the rear end face satisfy Rf<Rr, W1<W3, and W2<W4. A width Wf of the ridge at the front end face, and a width Wr of the ridge at the rear end face satisfy Wf>Wr. The ridge includes a region where a width decreases with distance from the front end side toward the rear end side.

16 Claims, 14 Drawing Sheets

SEMICONDUCTOR LASER DEVICE

CROSS-REFERENCE TO RELATED APPLICATION

This application claims priority under 35 U.S.C. §119(a) on Japanese Patent Application No. 2008-145939 filed on Jun. 3, 2008, the entire contents of which are hereby incorporated by reference.

BACKGROUND

The present disclosure relates to a semiconductor laser device having a high light output at which thermal saturation occurs, and a low operating current even in a high-temperature and high-output operating state.

Semiconductor laser devices (hereinafter referred to also as semiconductor lasers) are widely used in various fields. For example, an AlGaInP semiconductor laser capable of providing red laser light in the 650 nm wavelength band is widely used as a light source in the field of an optical disk system represented by DVD. As a semiconductor laser, there has been known a laser which uses a dielectric film for a current block layer to reduce the number of times that crystal growth is performed in the process of producing the semiconductor laser, and thereby reduce fabrication cost and lead time (see, e.g., Japanese Laid-Open Patent Publication No. 2005-64328).

FIG. 21 shows an example of an AlGaInP semiconductor laser having such a structure.

FIG. 21 is a cross-sectional schematic diagram of the AlGaInP laser in a first conventional embodiment.

The semiconductor laser shown in FIG. 21 has a ridge stripe structure in which an n-type GaAs buffer layer 102, an n-type AlGaInP clad layer 103, a non-doped AlGaInP optical guide layer 104, a multiple quantum well active layer 105, a non-doped AlGaInP optical guide layer 106, a p-type AlGaInP clad layer 107, a p-type GaInP hetero buffer layer 108, a p-type GaAs cap layer 109, and a laminated current block layer 112 are formed on an n-type GaAs substrate 101, and an n-side electrode 113 and a p-side electrode 114 are further formed on the back surface of the n-type substrate 101 and on the contact layer 109, respectively.

The n-type GaAs substrate 101 is made of a Si-doped n-type GaAs substrate. The n-type GaAs buffer layer 102 is made of a Si-doped n-type GaAs layer (with a Si concentration n of $2\times10^{18}$ cm$^{-3}$ and a film thickness t of 0.5 μm). The n-type AlGaInP clad layer 103 is made of a Si-doped n-type $(Al_{0.7}Ga_{0.3})_{0.5}In_{0.5}P$ layer (with a carrier concentration of $1\times10^{18}$ cm$^{-3}$ and a film thickness t of 1.5 μm). The non-doped AlGaInP optical guide layer 104 is made of a non-doped $(Al_{0.5}Ga_{0.5})_{0.5}In_{0.5}P$ layer (with a film thickness t of 25 nm). The multiple quantum well active layer 105 is made of a non-doped $(Al_{0.5}Ga_{0.5})_{0.5}In_{0.5}P$ well (including three layers with a film thickness t of 5 nm), and a non-doped $Ga_{0.5}In_{0.5}P$ well (including four layers with a film thickness t of 6 nm). The non-doped AlGaInP optical guide layer 106 is made of a non-doped $(Al_{0.5}Ga_{0.5})_{0.5}In_{0.5}P$ layer (with a film thickness t of 25 nm). The p-type AlGaInP clad layer 107 is made of a Zn-doped p-type $(Al_{0.7}Ga_{0.3})_{0.5}In_{0.5}P$ layer (with a carrier concentration of $1\times10^{18}$ cm$^{-3}$ and a film thickness t of 1.3 μm). The p-type GaInP hetero buffer layer 108 is made of a Zn-doped p-type $Ga_{0.5}In_{0.5}P$ layer (with a carrier concentration of $1\times10^{18}$ cm$^{-3}$ and a film thickness t of 50 nm). The p-type GaAs cap layer 109 is made of a Zn-doped GaAs layer (with a carrier concentration of $1\times10^{19}$ cm$^{-3}$ and a film thickness t of 200 nm).

The current block layer 112 is made of a silicon nitride film 110 (with a film thickness t of 10 nm) and a hydrogenated amorphous silicon film 111 (with a film thickness t of 100 nm).

Additionally, in order to reduce damage to a ridge portion in the case of performing assembly by junction-down mounting, a pair of protruding portions 115 which are higher in level than the ridge portion are formed with the ridge portion being interposed therebetween.

In the semiconductor laser shown in FIG. 21, a current injected from the p-type GaAs cap layer 109 is constricted only to the ridge portion by the current block layer 112 made of a dielectric material, and concentratively injected into the multiple quantum well active layer 105 in the vicinity of the ridge bottom portion. In this manner, despite a small amount of injected current on the order of several tens of milliamperes, an inverted population state of carriers necessary for laser oscillation is implemented. At this time, light is generated through carrier recombination, and confined in a direction perpendicular to the multiple quantum well active layer 105 by both of the n-type AlGaInP clad layer 103 and the p-type AlGaInP first clad layer 107. In a direction parallel with the multiple quantum well active layer 105, the generated light can be confined because the current block layer 112 made of the dielectric material is lower in refractivity than the p-type AlGaInP first clad layer 107, and an effective refractivity inside the ridge can accordingly be set higher than that outside the ridge. As a result, laser oscillation can be caused when a gain resulting from the injected current surpasses a loss in a waveguide.

The dielectric film is deposited on each of the sidewall portions of the ridge by a thickness according to a deposition time thereof, and a deposition speed is substantially constant regardless of surface orientation. Therefore, when the dielectric film is used for a current block layer in a ridge-type laser, the dielectric film is deposited in a shape reflecting the shape of each of depressed portions outside the ridge so that, in regions outside the ridge, trench portions are formed between the ridge and a pair of the protruding portions (the regions with the protruding portions will be hereinafter referred to as wing regions).

With regard to the shapes of the trenches, such configurations as those shown in FIGS. 22 to 24 shown in Japanese Laid-Open Patent Publications Nos. 2003-158344 and HEI 10-173277 have been reported. That is, there have been proposed the configuration in which a ridge 121 has a tapered shape in the longitudinal direction of a resonator, while wing regions 120 are each formed in a direction parallel with a normal to a resonator surface (FIG. 22), the configuration in which the ridge 121 has a tapered shape in the longitudinal direction of the resonator, while the wing regions 120 are each formed parallel with the ridge 121 having the tapered shape (FIG. 23), and the configuration in which the ridge 121 has a uniform shape in the longitudinal direction of the resonator, while the wing regions 120 are each formed in a direction inclined with respect to the normal to the resonator surface (FIG. 24). Trenches 122 are trenches between the ridge 121 and the wing regions 120.

SUMMARY

In the conventional example shown in FIG. 22, the ridge 121 has the tapered shape in the longitudinal direction of the resonator, while the wing regions 120 are each formed in the direction parallel with the normal to the resonator surface. In this configuration, the shape of the ridge 121 linearly monotonously changes in the longitudinal direction of the resonator, and a region where the width of the ridge 121 is constant is not formed. In the conventional example shown in FIG. 23, the ridge 121 has the tapered shape in which the ridge width linearly monotonously changes in the longitudinal direction of the resonator, while the wing regions 120 are each formed parallel with the ridge 121 having the tapered shape. In this configuration, the spacings between the ridge 121 and the wing regions 120 are constant in the longitudinal direction of the resonator. In the conventional example shown in FIG. 24, the ridge 121 has the uniform shape in the longitudinal direction of the resonator, while the wing regions 120 are each formed in the direction inclined with respect to the normal to the resonator surface. In this configuration, the ridge 121 has a linear shape, and does not have a tapered shape in which the width of the ridge 121 changes in the longitudinal direction of the resonator.

As described above, in the ridge-type semiconductor laser device, to reduce a strain occurring in the ridge portion when junction-down mounting is performed, the wing regions are formed outside the ridge.

A description will be given hereinbelow to the widths of the trenches formed between the ridge and the wing regions.

When the widths of the trenches are small, the light distribution of guided light which is guided by the ridge portion is likely to reach the wing regions. To cause stable basic transverse mode oscillation, an effective refractivity inside the ridge is set higher than that outside the ridge, and the effective refractivity difference ($\Delta N$) therebetween is set to a value in the range of $3\times10^{-3}$ to $7\times10^{-3}$. Since each of the wing regions has substantially the same layer structure as that of the ridge portion, the effective refractivity of the wing region is substantially equal to that of the ridge portion. The effective refractivity of the light distribution determined by the propagation constant of a guided mode has a value between the effective refractivity of the ridge portion and the effective refractivity outside the ridge. In this case, the effective refractivity of the distribution of guided light is lower than the effective refractivity of the wing region. In general, the configuration of the intensity distribution of the guided light involves a vibration-type component in the shape of a sine curve in a region having an effective refractivity higher than that of the guided light, and involves an attenuation-type component in the shape of an exponential function in a region having an effective refractivity lower than that of the guided light. Accordingly, when the light distribution of the guided light extends to reach the wing regions, a vibration component which does not attenuate in a direction outward of the ridge occurs in the bottom portion of the light distribution to cause a disturbance in a beam radiation pattern or FFP (Far-Field Pattern). When a semiconductor laser is used as a light source for an optical pick-up, the disturbance in FFP becomes a factor which varies the efficiency of laser light intake into a lens, and presents a serious obstacle in practical use. Accordingly, when the widths of the trench portions are excessively reduced, a disturbance is likely to occur in FFP, and therefore the widths of the trench portions cannot be reduced excessively. In addition, when the widths of the trench portions are reduced, the wing regions each having a high effective refractivity are closer to the ridge portion so that high-order transverse mode oscillation is likely to occur, and a kink which is a non-linear bend or curl is likely to occur in a current-light output characteristic. When the kink has occurred, the light output does not increase even when the injected current is increased to present a serious obstacle in practical use. For this reason also, the widths of the trenches cannot be excessively reduced.

On the other hand, when the widthwise dimensions of the trenches are enlarged to prevent the bottom portion of the light distribution from reaching the wing regions, the heat emission property of heat generated from a light emitting portion deteriorates. As a result, when the semiconductor laser is operated in a high-temperature environment, the operating current consequently increases to degrade a temperature characteristic. When a semiconductor laser element is mounted by junction-down mounting, a strain occurring in the ridge increases to reduce the intensity ratio (polarization ratio) between a TE mode and a TM mode in laser right. In the optical system of the optical pick-up device, a polarization optical component such as a polarization beam splitter is used in most cases so that a reduction in the polarization ratio in the laser light leads to a reduction in the intensity of the laser light to present a serious obstacle in practical use. Accordingly, to obtain an excellent temperature characteristic and a high polarization ratio, the widths of the trenches cannot be increased excessively.

Therefore, by merely forming the trenches between the wing regions and the ridge portion so as to set the effective refractivity difference ($\Delta N$) to a value in the range of $3\times10^{-3}$ to $7\times10^{-3}$, it is impossible to satisfy all of the requirements of an excellent temperature characteristic, a high polarization ratio, a FFP free from disturbance, and a high kink light output.

In view of the foregoing, an object of the present invention is to provide a semiconductor laser device which uses a dielectric film for a current block layer, and can satisfy all of the requirements of an excellent temperature characteristic, a high polarization ratio, a FFP free from disturbance, and a high kink light output.

To attain the above-mentioned object, a semiconductor laser device according to an example first embodiment of the present invention includes: an n-type clad layer formed on a substrate; an active layer formed on the n-type clad layer; and a p-type clad layer formed on the active layer to have a striped ridge and wing regions, the wing regions being provided with a first trench present on one side of the ridge and a second trench present on the other side thereof being interposed therebetween, wherein a reflectivity Rf at a front end face as a light extraction side of a resonator, a reflectivity Rr at a rear end face of the resonator, a minimum value W1 of a width of the first trench in a region adjacent to the front end face, a minimum value W2 of a width of the second trench in the region adjacent to the front end face, a width W3 of the first trench at the rear end face, and a width W4 of the second trench at the rear end face satisfy a relational expression shown below: Rf<Rr, W1<W3, and W2<W4, a width Wf of the ridge at the front end face, and a width Wr of the ridge at the rear end face satisfy a relational expression shown below: Wf>Wr, and the ridge includes a region where a width decreases with distance from the front end side toward the rear end side.

In the arrangement, the distance between the ridge portion and each of the wing regions is reduced on the front end side where a light density is high in the active layer within the waveguide, and an amount of generated heat is large, thereby allowing an improvement in heat emission property. In addition, the distance between the ridge portion and the wing region is reduced at the front end portion where the light density is highest within the waveguide. As a result, it is possible to reduce a strain which occurs in the ridge when junction-down mounting is performed, and suppress a reduction in polarization ratio. Moreover, the ridge has a tapered shape in which a ridge width on the front end side where the light density is high in the active layer within the waveguide is larger than the ridge width at the rear end portion. Accordingly, it is possible to increase the amount of current injected into the front end side where the light density is higher, and the number of carriers consumed by induced emission in the active layer is larger than on the rear end side, and provide a uniform density of operating carriers in the active layer in the longitudinal direction of the resonator. This allows a laser oscillation wavelength which provides a largest gain in the active layer to be substantially equal in the longitudinal direction of the resonator, and the carriers injected into the active layer are efficiently consumed through radiative recombination resulting from induced emission, so that an external differential quantum efficiency (slope efficiency) in a current-light output characteristic is improved. An improvement in slope efficiency is effective in reducing an operating current value, and allows an improvement in temperature characteristic. Further, since the widths of trenches are large at the rear end portion, it is possible to prevent scattered light that has leaked from the tapered portion of the ridge from being reflected by the rear end face, being coupled again to a guided mode which is guided by the ridge portion, and causing a disturbance in FFP, and prevent the coupling between the wing regions and the light distribution, the resulting occurrence of high-order transverse mode oscillation, and the resulting reduction in kink light output.

A semiconductor laser device according to an example second embodiment of the present invention includes: an n-type clad layer formed on a substrate; an active layer formed on the n-type clad layer; and a p-type clad layer formed on the active layer to have a striped ridge and wing regions, the wing regions being provided with a first trench present on one side of the ridge and a second trench present on the other side thereof being interposed therebetween, wherein a reflectivity Rf at a front end face as a light extraction side of a resonator, a reflectivity Rr at a rear end face of the resonator, a width W1 of the first trench at the front end face, a width W2 of the second trench at the front end face, a width W3 of the first trench at the rear end face, and a width W4 of the second trench at the rear end face satisfy a relational expression shown below: Rf<Rr, W1<W3, and W2<W4, a width Wf of the ridge at the front end face, and a width Wr of the ridge at the rear end face satisfy a relational expression shown below: Wf>Wr, and the ridge includes a region where a width decreases with distance from the front end side toward the rear end side.

In the arrangement, the distance between the ridge portion and each of the wing regions is reduced on the front end side where a light density is high in the active layer within the waveguide, and an amount of generated heat is large, thereby allowing an improvement in heat emission property. In addition, the distance between the ridge portion and the wing region is reduced at the front end portion where the light density is highest within the waveguide. As a result, it is possible to reduce a strain which occurs in the ridge when junction-down mounting is performed, and suppress a reduction in polarization ratio. Moreover, the ridge has a tapered shape in which a ridge width on the front end side where the light density is high in the active layer within the waveguide is larger than the ridge width at the rear end portion. Accordingly, it is possible to increase the amount of current injected into the front end side where the light density is higher, and the number of carriers consumed by induced emission in the active layer is larger than on the rear end side, and provide a uniform density of operating carriers in the active layer in the longitudinal direction of the resonator. This allows a laser oscillation wavelength which provides a largest gain in the active layer to be substantially equal in the longitudinal direction of the resonator, and the carriers injected into the active layer are efficiently consumed through radiative recombination resulting from induced emission, so that an external differential quantum efficiency (slope efficiency) in a current-light output characteristic is improved. An improvement in slope efficiency is effective in reducing an operating current value, and allows an improvement in temperature characteristic. Further, since the widths of trenches are large at the rear end portion, it is possible to prevent scattered light that has leaked from the tapered portion of the ridge from being reflected by the rear end face, being coupled again to a guided mode which is guided by the ridge portion, and causing a disturbance in FFP, and prevent the coupling between the wing regions and the light distribution, the resulting occurrence of high-order transverse mode oscillation, and the resulting reduction in kink light output.

In addition, since the widths of the trenches are minimal at the front end portion where the light density is largest, the temperature characteristic can be improved.

As a result, it is possible to implement a semiconductor laser device which satisfies all of the requirements of an excellent temperature characteristic, a high polarization ratio, a FFP free from disturbance, and a high kink light output.

In the semiconductor laser device according to the example first or second embodiment of the present invention, a distance from a center of the ridge on the front end side to each of the wing regions on the front end side is smaller than a distance from the center of the ridge on the rear end side to each of the wing regions on the rear end side.

In the arrangement, the widths of the trenches at the rear end portion are increased. Therefore, it is possible to prevent scattered light that has leaked from the tapered portion of the ridge from being reflected by the rear end face, being coupled again to the guided mode which is guided by the ridge portion, and causing a disturbance in FFP, and prevent the coupling between the wing regions and the light distribution, the resulting occurrence of high-order transverse mode oscillation, and the resulting reduction in kink light output.

As a result, it is possible to implement a semiconductor laser device which satisfies all of the requirements of an excellent temperature characteristic, a high polarization ratio, a FFP free from disturbance, and a high kink light output.

In the semiconductor laser device according to the example first or second embodiment of the present invention, the distance from the center of the ridge to each of the wing regions includes a portion where a width is constant between the front end side and the rear end side, and a portion where a width increases with distance from the front end side toward the rear end side.

With the arrangement, it is possible to emit heat generated in the active layer in the vicinity of the ridge portion via the wing regions in a region where the distance from the center of the stripe to the outside of the trench is widthwise constant between the front end side and the rear end side, and further improve the temperature characteristic.

In the semiconductor laser device according to the example first or second embodiment of the present invention, in a region where the width of the ridge decreases with distance from the front end side toward the rear end side, the distance from the center of the ridge to the wing region widthwise increases with distance from the front end side toward the rear end side.

In the arrangement, the width of the trench is increased in the tapered portion of the ridge. Therefore, it is possible to prevent scattered light that has leaked from the tapered portion of the ridge from being reflected by the rear end face, being coupled again to the guided mode which is guided by the ridge portion, and causing a disturbance in FFP, and prevent the coupling between the wing regions and the light distribution, the resulting occurrence of high-order transverse mode oscillation, and the resulting reduction in kink light output.

As a result, it is possible to implement a semiconductor laser device having a FFP with fewer disturbances, and a higher kink light output.

In the semiconductor laser device according to the example first or second embodiment of the present invention, in the region where the width of the ridge decreases with distance from the front end side toward the rear end side, a tilt angle θ1 of a side surface of the ridge with respect to a longitudinal direction of the resonator is not more than 0.3°, and, in a region where the distance from the center of the ridge to the wing region increases with distance from the front end side toward the rear end side, a tilt angle θ2 of a side surface of the wing region closer to the ridge with respect to the longitudinal direction of the resonator is larger than the angle θ1.

The arrangement allows a reduction in waveguide loss occurring in the tapered portion. In addition, it is possible to prevent scattered light that has leaked from the tapered portion of the ridge from being reflected by the rear end face, being coupled again to the guided mode which is guided by the ridge portion, and causing a disturbance in FFP, and prevent the coupling between the wing regions and the light distribution, the resulting occurrence of a high-order transverse mode oscillation, and the resulting reduction in kink light output.

As a result, it is possible to implement a semiconductor laser device having a higher slope efficiency, a high kink light output, and a FFP free from disturbance.

In the semiconductor laser device according to the example first or second embodiment of the present invention, the width W1 of the first trench and the width W2 of the second trench on the front end side are each not less than 6 μm, and not more than 15 μm.

With the arrangement, it is possible to reduce a strain occurring in the ridge when junction-down mounting is performed, while preventing the bottom of the light distribution from reaching the wing regions, and maintain an excellent property of heat emission from the wing regions.

As a result, it is possible to implement a semiconductor laser device which satisfies all of the requirements of an excellent temperature characteristic, a high polarization ratio, a FFP free from disturbance, and a high kink light output.

In the semiconductor laser device according to the example first or second embodiment of the present invention, the width W3 of the first trench and the width W4 of the second trench on the rear end side are each not less than 7 μm, and the width W3 of the first trench on the rear end side is larger than the width W1 of the first trench on the front end side, and the width W4 of the second trench on the rear end side is larger than the width W2 of the second trench on the front end side.

With the arrangement, it is possible to reduce the strain occurring in the ridge when junction-down mounting is performed, while more reliably preventing the bottom of the light distribution from reaching the wing regions, and maintain an excellent property of heat emission from the wing regions.

As a result, it is possible to implement a semiconductor laser device which satisfies all of the requirements of an excellent temperature characteristic, a high polarization ratio, a FFP free from disturbance, and a high kink light output.

A semiconductor laser device according to an example third embodiment of the present invention is a dual-wavelength semiconductor laser device including a red laser and an infrared laser each integrated on a single substrate, wherein each of the red laser and the infrared laser has a structure of the semiconductor laser device according to the example first embodiment of the present invention.

As a result, it is possible to implement a semiconductor laser device which satisfies all of the requirements of an excellent temperature characteristic, a high polarization ratio, a FFP free from disturbance, and a high kink light output.

Thus, with the semiconductor laser device according to each of the example embodiments of the present invention, it is possible to achieve an improvement in the efficiency of photoelectric conversion in which carriers injected into the active layer are converted to laser light, a reduction in the strain occurring in the ridge when junction-down mounting is performed, and an improvement in heat emission property at the front end portion where the light density is highest within the waveguide. It is also possible to prevent scattered light that has leaked from the tapered portion of the ridge from being reflected by the rear end side and coupled again to the guided mode which is guided by the ridge portion, prevent the bottom of the light distribution from reaching the wing regions, and prevent the occurrence of a disturbance in FFP, the coupling between the wing regions and the light distribution, the resulting occurrence of high-order transverse mode oscillation, and the resulting reduction in kink light output.

BRIEF DESCRIPTION OF THE DRAWINGS

FIGS. 8A to 8C are graphs each showing the result of an experiment on the dependence of a FFP on the front-end ridge-wing region spacing in the example first embodiment, of which FIG. 8A shows the case where the front-end ridge-wing region spacing is 3 μm, FIG. 8B shows the case where the front-end ridge-wing region spacing is 4 μm, and FIG. 8C shows the case where the front-end ridge-wing region spacing is 5 μm;

DETAILED DESCRIPTION

Hereinbelow, example embodiments of the present invention will be described with reference to the accompanying drawings.

Embodiment 1

Figure 1:
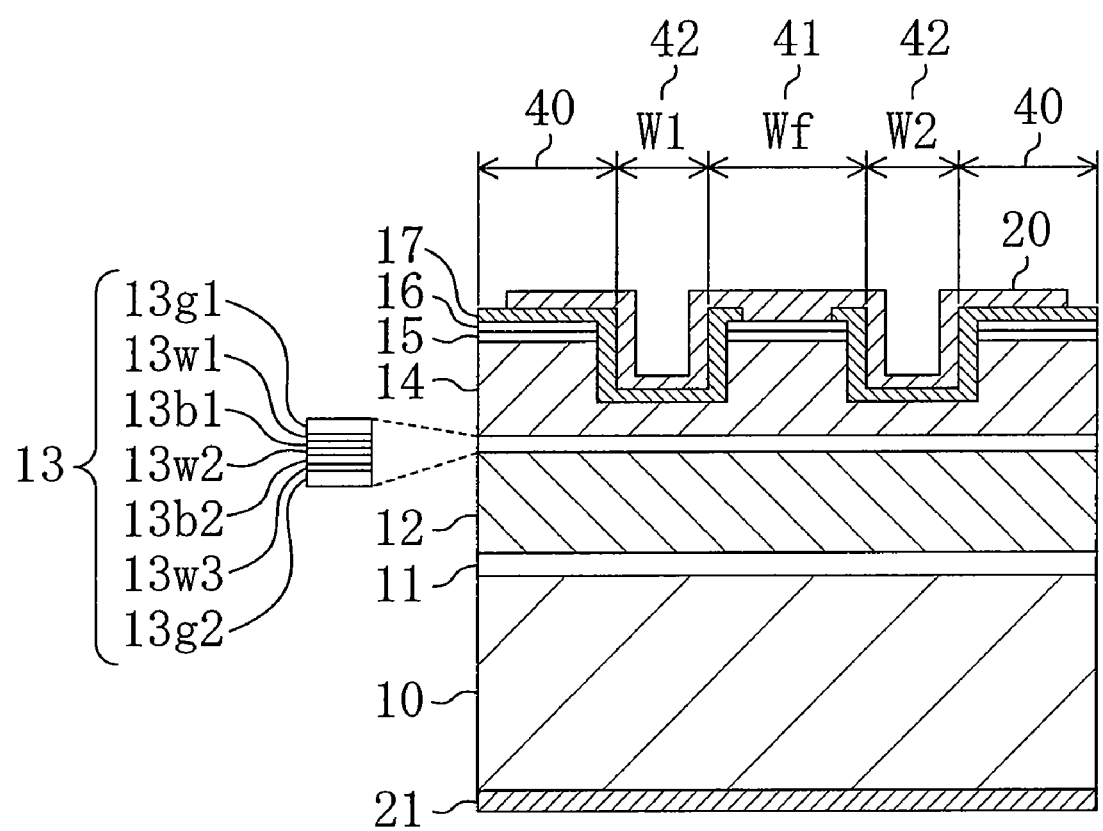
FIG. 1 is a cross-sectional view showing a semiconductor laser device in an example first embodiment of the present invention.

FIG. 1 shows a cross-sectional structure of a semiconductor laser device according to the example first embodiment of the present invention.

In this structure, a red laser and an infrared laser are integrated on an n-type GaAs substrate 10 having, as a principal surface, a surface 10° tilted from the (100) plane in the [011] direction. First, a structure of the red laser shown in FIG. 1 will be described.

In the red laser, there are formed an n-type GaAs buffer layer 11 (0.5 μm), an n-type $(Al_{0.7}Ga_{0.3})_{0.51}In_{0.49}P$ clad layer 12 (2.0 μm), a strained quantum well active layer 13, a p-type $(Al_{0.7}Ga_{0.3})_{0.51}In_{0.49}P$ clad layer 14, a p-type $Ga_{0.51}In_{0.49}P$ protective layer 15 (500 Å), and a p-type GaAs contact layer (0.4 μm) 16. As shown in the drawing, the strained quantum well active layer 13 has a laminated structure of an $(Al_{0.5}Ga_{0.5})_{0.51}In_{0.49}P$ first guide layer 13g1, GaInP well layers 13w1 to 13w3, AlGaInP barrier layers 13b1 and 13b2, and an AlGaInP second guide layer 13g2. In the p-type $(Al_{0.7}Ga_{0.3})_{0.51}In_{0.49}P$ clad layer 14, the distance from the upper end portion of a ridge to the active layer 13 is 1.4 μm, and the distance (dp) between the lower end portion of the ridge and the active layer 13 is set to 0.2 μm.

On each of the side surfaces of the ridge, a current block layer 17 made of SiN is formed, and an opening for injecting a current into a ridge portion 41 is formed over the ridge. On the current block layer 17 and over the opening over the ridge, an electrode 20 is formed. Under the substrate 10, an electrode 21 is formed. A current for driving the red laser is allowed to flow through the electrode 20 and the electrode (back electrode) 21.

In this structure, the current injected from the p-type GaAs contact layer 16 is constricted only to the ridge portion by the current block layer 17, and concentratively injected into the active layer 13 located below the ridge bottom portion. As a result, an inverted population state of carriers necessary for laser oscillation is implemented with a small amount of injected current on the order of several tens of milliamperes. Light emitted through the recombination of the carriers injected into the active layer 13 undergoes perpendicular light confinement in a direction perpendicular to the active layer 13 by the clad layers 12 and 14. In a direction parallel with the active layer, horizontal light confinement occurs because the current block layer 17 made of SiN is lower in refractivity than the clad layers. In addition, because the current block layer 17 is transparent with respect to laser oscillation light, there is no light absorption, and a low-loss waveguide can be implemented. The effective refractivity difference (Δn) between the inside and outside of a stripe can be precisely controlled by the order of $10^{-3}$ with the distance dp. As a result, it is possible to obtain a high-output semiconductor laser with a low operating current, while precisely controlling a light distribution.

To improve a heat emission property during a high-temperature operation at 80° C., a resonator length in a high-output laser of 350 mW or more is set to 1500 μm or more to reduce the density of an operating current. In the present embodiment, the resonator length is set to 1500 μm. The front end face and the rear end face of a resonator are each coated with a dielectric film to have respective reflectivities of 7% and 94%.

On both sides of the ridge 41 in the structure shown in FIG. 1, wing regions 40 are provided to prevent the localization of a strain to the ridge 41 when the semiconductor laser device is mounted by junction-down mounting on a heat sink. Between the wing regions 40 and the ridge 41, trenches 42 are formed.

First, a description will be given to a shape of the ridge 41 in a longitudinal direction of the resonator.

Figure 2:
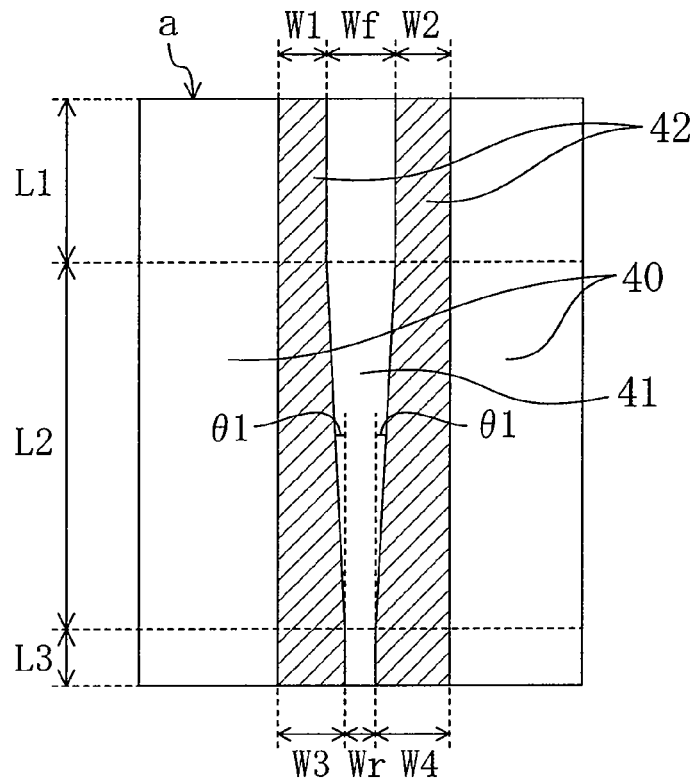
FIG. 2 is a plan view showing the respective shapes of a ridge, trenches, and wing regions in the semiconductor laser in the example first embodiment.

FIG. 2 shows the ridge shape in the longitudinal direction of the resonator in the semiconductor laser device according to the first embodiment. The end face a in FIG. 2 corresponds to the cross section of FIG. 1.

As shown in FIG. 2, the ridge 41 is formed to have a width such that the width (Wf) of the ridge 41 on the front end side coated with the dielectric material so as to have a low reflectivity (Rf) is larger than the width (Wr) of the ridge on the rear end side coated with the dielectric material so as to have a high reflectivity (Rr). The ridge 41 has the constant width Wf in a portion extending from the front end face over a length L1 (region adjacent to the front end face), and the constant width Wr in a portion (region adjacent to the rear end face) extending from the rear end face over a length L3. The width of the ridge 41 in the portion between the portion extending from the front end face over the length L1 and the portion extending from the rear end face over the length L3 has a tapered shape having a tilt at an angle θ1, as shown in FIG. 2.

In the example first embodiment, the front end face and the rear end face are coated with the dielectric films so as to have the low reflectivity and the high reflectivity, respectively. In this case, a light intensity in the active layer in the longitudinal direction of the resonator has a characteristic of being higher at the front end face than at the rear end face. When the light intensity is high, the number of carriers consumed by radiative recombination resulting from induced emission in the active layer is large. To provide a high photoelectric conversion efficiency by providing a substantially constant operating carrier density distribution in the active layer in the longitudinal direction of the resonator, and holding the oscillation wavelength which provides a largest gain as equal as possible within the resonator, it is necessary to inject a larger number of carriers into the active layer on the front end side than those injected into the active layer on the rear end side. In satisfying the necessity, it is effective to set the width Wf to a value larger than the width Wr, and increase an amount of current injected into the front end side. Thus, in the semiconductor laser device in which the front end face and the rear end face are coated with the dielectric films so as to have the low reflectivity and the high reflectivity, respectively, the efficiency of conversion from the injected current to laser oscillation light can be increased by setting the width Wf to a value larger than the width Wr. As a result, a slope efficiency is improved compared with that in an element having a typical striped structure in which the width Wf and the width Wr are the same.

When the width Wf is increased, an area of the portion of the ridge 41 where a current is injected increases to allow a reduction in the differential resistance of the element, and thereby allow a reduction in operating voltage. The reduction in operating voltage leads to a reduction in the power consumption of the element during an operation, and can reduce a temperature rise in the active layer during the operation. By reducing the temperature rise in the active layer, it is possible to suppress carrier overflow, and reduce an operating current value during a high-temperature operation.

However, when the width Wf is merely increased, a high-order transverse mode is not cut off, and a kink is likely to occur. To prevent high-order transverse mode oscillation, it is necessary to cut off the high-order transverse mode. In satisfying the necessity, it is effective to reduce the width Wr of the ridge 41 on the rear end side. In cutting off the high-order transverse mode in a semiconductor laser element having a structure designed to reduce Δn from 3 to $10^{-3}$ to $6 \times 10^{-3}$ in a state where current injection into the semiconductor laser element is not performed, it is effective to provide a stripe width such that the width Wr is not more than 2.5 μm. As the light output is increased by increasing the operating current of the semiconductor laser element, the refractivities of the clad layers in the ridge portion increase to increase Δn so that the high-order transverse mode is not cut off, and the high-order transverse mode oscillation is likely to occur. Accordingly, to cut off the high-order transverse mode even during a high-temperature and high-output operation, the width Wr needs to be reduced to a value of not more than 2 μm. When the width Wr is excessively reduced, a reduction in the area of the portion where a current is injected leads to an increase in differential resistance, and to an increase in operating voltage. Therefore, in cutting off the high-order transverse mode without causing an increase in operating voltage, it is effective to set the width Wr to a value in the range of 1.5 μm to 2 μm, or preferably 1.5 μm to 1.8 μm. In the example first embodiment, the width Wr is set to 1.6 μm.

To further suppress the high-order transverse mode oscillation, it is not only important to reduce the width Wr, but also to adjust the length L3 of the portion where the width Wr of the ridge is constant in a region adjacent to the rear end side. When the length L3 is small, the ratio of a region with a large ridge width where the high-order transverse mode is not cut off when the semiconductor laser device is caused to perform the high-temperature and high-output operation increases to cause the high-order transverse mode oscillation, and consequently cause a kink in current-light output characteristic. Therefore, to prevent the occurrence of a kink, the length L3 is preferably possibly maximized. However, when the length L3 is excessively increased, an increase in differential resistance due to a reduction in the area of the portion where a current is injected leads to an increase in operating voltage, and to an increase in power consumption to result in the degradation of a high-temperature operation property. Therefore, to prevent the occurrence of a kink without causing an increase in operating voltage, the length L3 may be set appropriately to a value in the range of not less than 200 μm and not more than 500 μm. In the example first embodiment, the length L3 is set to 450 μm to suppress the high-order transverse mode oscillation without causing an increase in operating current.

In obtaining a high slope efficiency for a laser in which the front end side and the rear end side are coated with dielectric films to have a low reflectivity and a high reflectivity, respectively, it is effective to provide a ratio of the width Wf to the width Wr which is generally equal to the ratio of a light density in the active layer adjacent to the front end portion to a light density at the rear end portion. The width of the ridge 41 in the longitudinal direction of the resonator may be changed appropriately substantially in proportion to the distribution of the light density in the active layer. Typically, in a high-output laser, to improve the efficiency of light extraction from the front end face, and obtain a high slope efficiency, the front end face and the rear end face are coated with dielectric films so as to have a reflectivity of 4% to 9%, and a high reflectivity of not less than 80%, respectively. In this case, the ratio of a light density in the vicinity of the rear end face to a light density in the active layer adjacent to the front end face is around 2. Therefore, in enhancing the efficiency of photoelectric conversion in the laser in which the front end face and the rear end face are coated with the ferroelectric films to have a low reflectivity of 4% to 9% and a high reflectivity of not less than 80%, respectively, it is effective to set the ratio of the width Wf to the width Wr to a value in the range of 1.5 to 2.5. In the example first embodiment, the width Wf is set to 3.5 μm, which is 2.2 times as large as the width Wr.

In reducing the differential resistance of the element, it is effective to possibly maximize the injection area by providing the ridge 41 with the same width as the width Wf. However, when the length L1 is excessively increased, the ratio of the region where the width of the ridge 41 is large to the area of the portion of the ridge 41 where a current is injected increases so that the high-order transverse mode oscillation is likely to occur. In addition, when the length L1 is excessively increased, a wavelength loss increases in a tapered region where the width of the ridge 41 changes to lead to a reduction in slope efficiency.

Figure 3:
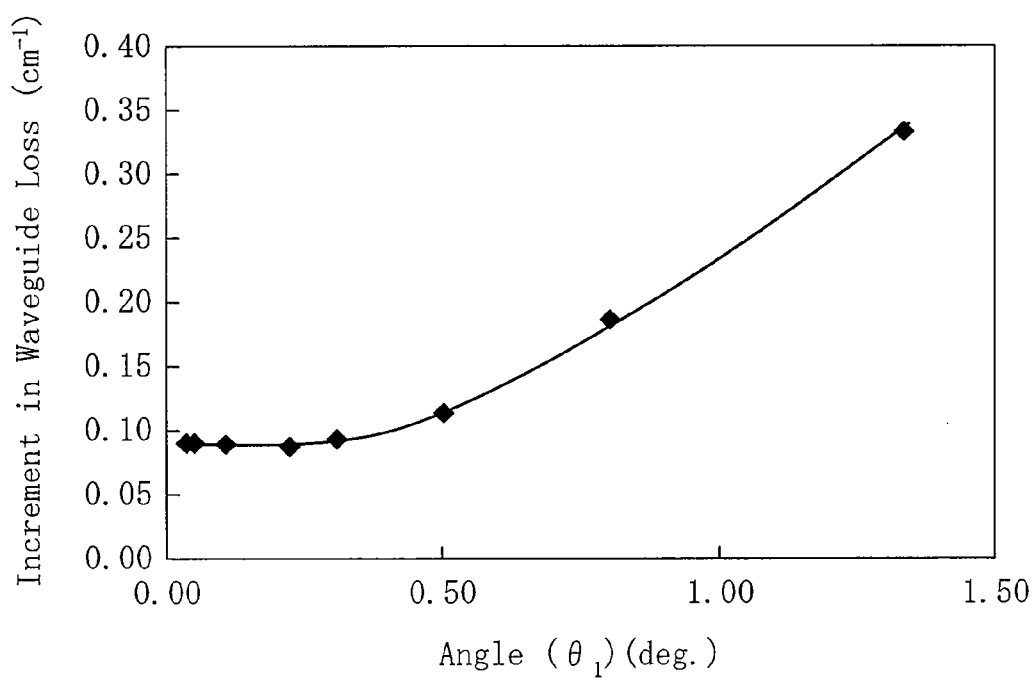
FIG. 3 is a graph showing the result of calculating the dependence of a waveguide loss on a taper angle (θ1) in the example first embodiment.

FIG. 3 shows the result of calculating the dependence of the wavelength loss on the tilt angle (θ1) of the ridge 41 in the foregoing tapered portion shown in FIG. 2 in the longitudinal direction of the resonator.

From FIG. 3, it will be understood that, when the angle θ1 is not less than 0.5°, the wavelength loss increases and, when the angle θ1 is not more than 0.4°, the wavelength loss is substantially constant. Therefore, by setting the taper angle such that the angle θ1 is not more than 0.3°, it becomes possible to prevent the deterioration of the slope efficiency due to an increase in wavelength loss.

Figure 4:
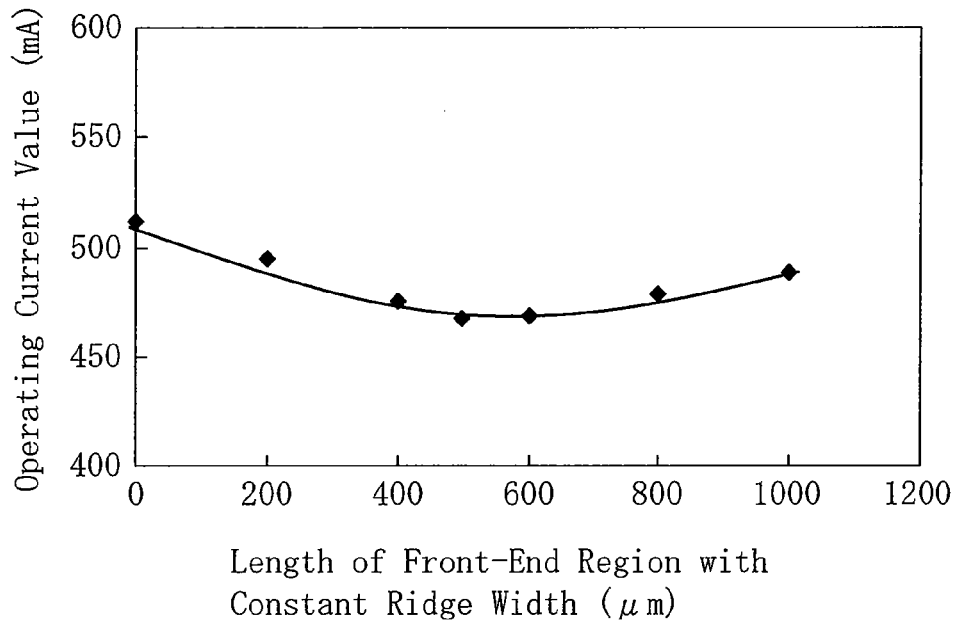
FIG. 4 is a graph showing the result of an experiment on the dependence of an operating current value on the length (L1) of the front-end region with a constant ridge width in the example first embodiment.
Figure 5:
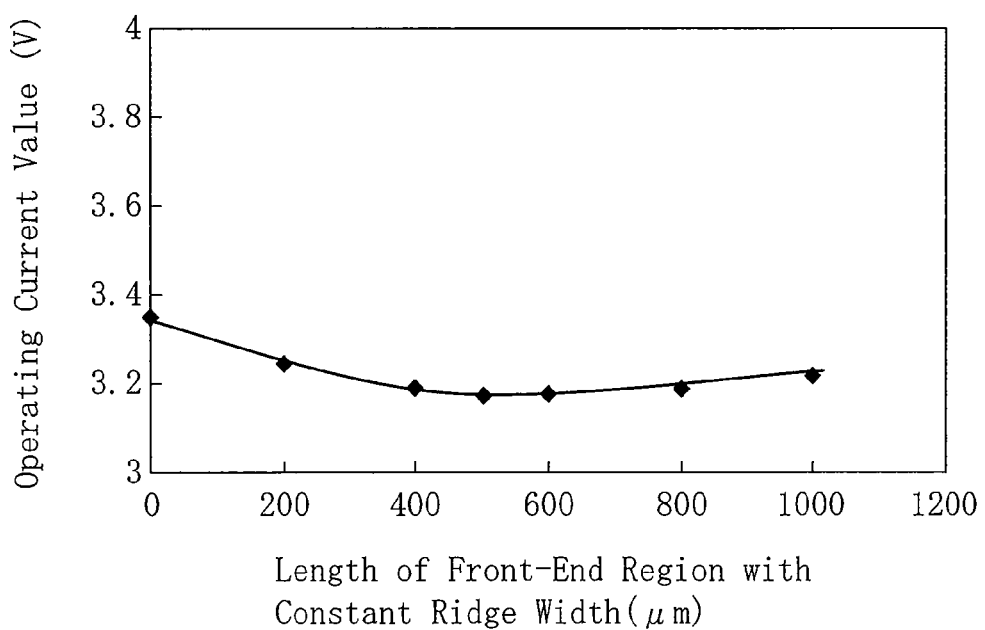
FIG. 5 is a graph showing the result of the experiment on the dependence of an operating voltage on the length (L1) of the front-end region with the constant ridge width in the example first embodiment.

FIGS. 4 and 5 show the result of an experiment on an operating current value and an operating voltage during a 300 mW operation when an element was mounted by junction-down mounting in a laser having a resonator length of 1500 μm in which the length L3 was held constant at 450 μm, the width Wf was set to 3.5 μm, and the width Wr was set to 1.6 μm, and when the laser was operated at 85° C. with a pulse width of 40 ns and a duty of 33%. Each of the widths W1 and W2 shown in FIG. 2 was set to 7 μm.

From FIG. 4, it will be understood that, as the length L1 was increased, the operating current value and the operating voltage decreased, and began to increase at a point where the length L1 was in the vicinity of 500 μm. From FIG. 5, it will be understood that, as the L1 was increased, the operating voltage decreased, and began to increase at a point where the length L1 was in the vicinity of 500 μm.

It can be considered that these results were obtained because, as the length L1 is increased, the area of the portion where a current is injected increases to reduce the differential resistance of the element, suppress heat generation from the operating element, and thereby improve the high temperature characteristic. It can also be considered that, when the length L1 is excessively increased, the discrepancy between the distribution of the light density within the active layer in the longitudinal length of the resonator and the distribution of the ridge width increases to reduce the efficiency of photoelectric conversion in which the injected current is converted to laser light, increase the operating current value, and also increase the operating voltage. From this, it can be considered that, to obtain a high photoelectric conversion efficiency without causing an increase in operating current by forming the ridge 41 into a tapered shape, the length L1 in a laser with a resonator length of not less than 1500 μm may be set appropriately to a value in the length range of ±200 μm which is ⅓ of the resonator length. In the present embodiment, the length L1 is set to 500 μm which is as large as ⅓ of the resonator length.

Figure 6:
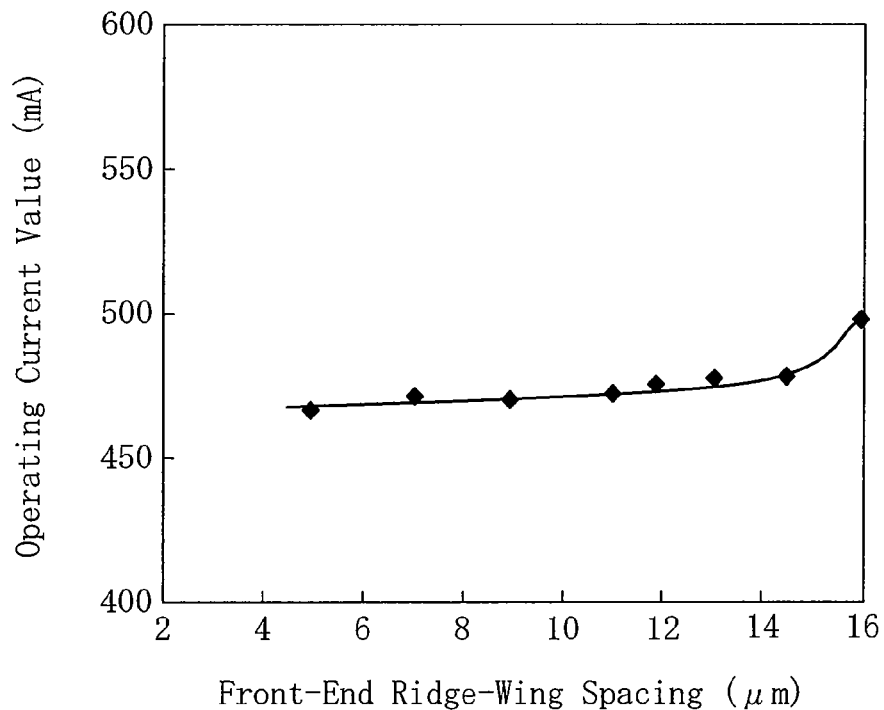
FIG. 6 is a graph showing the result of an experiment on the dependence of the operating current value on a front-end ridge-wing region spacing in the example first embodiment.

Next, FIG. 6 shows the result of an experiment on an operating current value during a 300 mW operation when the element was mounted by junction-down mounting in the structure shown in FIG. 2, the length L1 was varied while setting the widths W1 and W2 between the ridge and the wing regions at the front end portion to the same value, and the element was operated at 85° C. with a pulse width of 40 ns and a duty of 33%.

From FIG. 6, it will be understood that, when the widths W1 and W2 were each set to a value of not less than 15 μm, the operating current value began to increase. This may be conceivably because, when the widths W1 and W2 are increased, the heat emission property of heat generated in the active layer in the vicinity of the ridge, and emitted through the wing regions decreases so that a temperature rise in the active layer is likely to increase, and the high temperature characteristic deteriorates. Therefore, it will be understood that, to prevent the deterioration of the high temperature characteristic, the widths W1 and W2 need to be reduced to values of not more than 15 μm.

Figure 7:
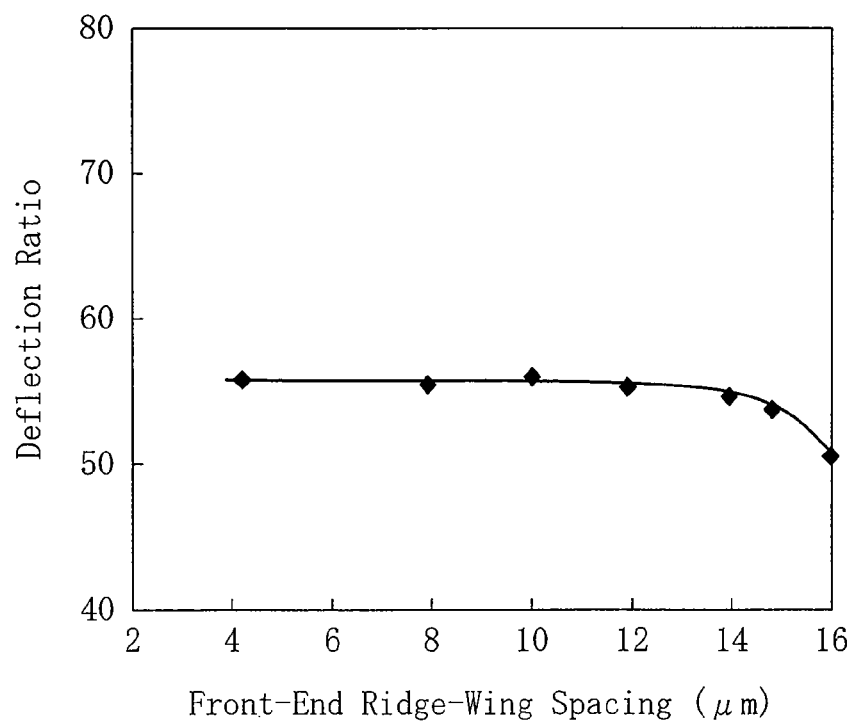
FIG. 7 is a graph showing the result of an experiment on the dependence of a polarization ratio on the front-end ridge-wing region spacing in the example first embodiment.

Next, FIG. 7 shows the result of an experiment on a polarization ratio in a continuous oscillation state at a room temperature with a light output of 3 mW when the element was mounted by junction-down mounting in the structure shown in FIG. 2, and the widths W1 and W2 between the ridge 41 and the wing regions 40 at the front end portion were varied, while being set to the same value.

From FIG. 7, it will be understood that the polarization ratio decreased when the widths W1 and W2 were each set to a value of not less than 16 μm. This may be conceivably because, when the widths W1 and W2 are increased, and the element is mounted by junction-down mounting, a strain occurring in the ridge portion increases to decrease the polarization ratio. Therefore, it can be considered that, to prevent a reduction in polarization ratio, it is necessary to set each of the widths W1 and W2 to a value of not more than 16 μm.

Figure 8A:
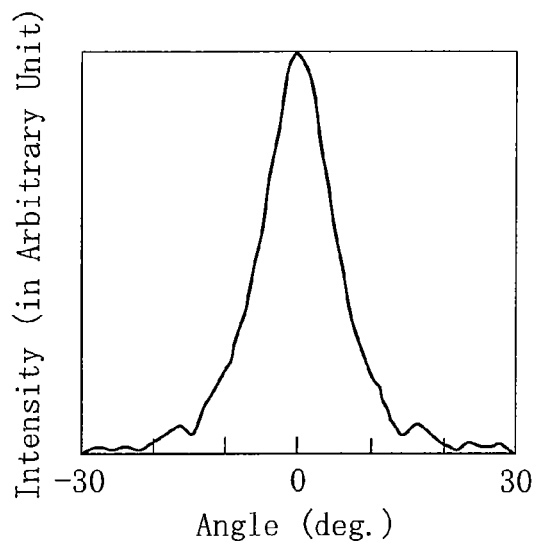
Figure 8B:
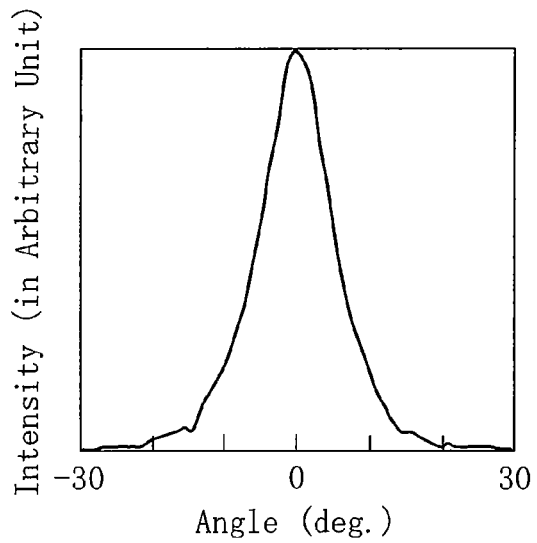
Figure 8C:
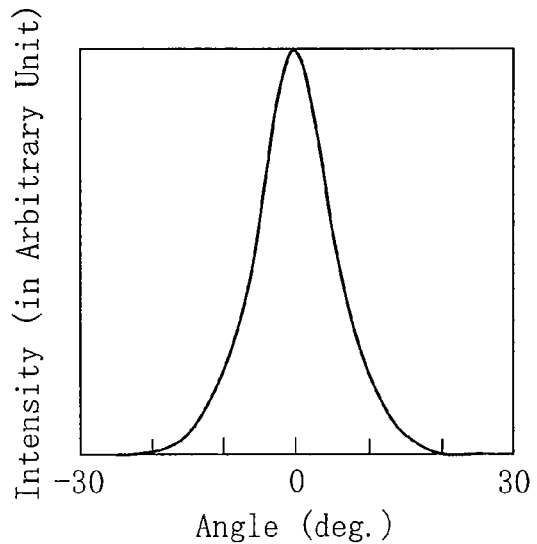

Next, FIGS. 8A to 8C show the results of measuring a FFP in a continuous oscillation state at a room temperature with a light output of 5 mW when the widths W1 and W2 between the ridge 41 and the wing regions 40 at the front edge portion were each varied from 3 μm to 5 μm in increments of 1 μm, while being set to the same value.

From FIGS. 8A to 8C, it will be understood that, when the spacings between the ridge 41 and the wing regions 40 are not more than 4 μm, a disturbance is likely to occur in the waveform of the FFP. This may be conceivably because, when the spacings between the ridge 41 and the wing regions 40 are reduced, the bottom of the horizontally transversely extending portion of the light distribution propagated by the waveguide reaches the wing regions 40 to cause a disturbance in the waveform of the light distribution propagated by the waveguide. In the case where the semiconductor laser is used as a light source for an optical pick-up, when a disturbance occurs in the waveform of the FFP, the usage efficiency of laser light with respect to a lens used in the optical system of the optical pick-up varies to present an obstacle in practical use. When the bottom of the horizontally transversely extending portion of the light distribution reaches the wing regions 40, the light distribution is coupled to the wing regions 40 to cause the high-order transverse mode oscillation, so that a kink light output is likely to lower. Therefore, to prevent the occurrence of a disturbance in the waveform of the FFP, it is necessary to set the spacings between the ridge 41 and the wing regions 40 to values of not less than 5 μm.

Based on the foregoing results of the experiments shown in FIGS. 6 to 8A to 8C, the example first embodiment sets each of the widths W1 and W2 to 7 μm to prevent the deterioration of the polarization ratio and the temperature characteristic as well as the occurrence of a disturbance in the waveform of the FFP.

Embodiment 2

Figure 9:
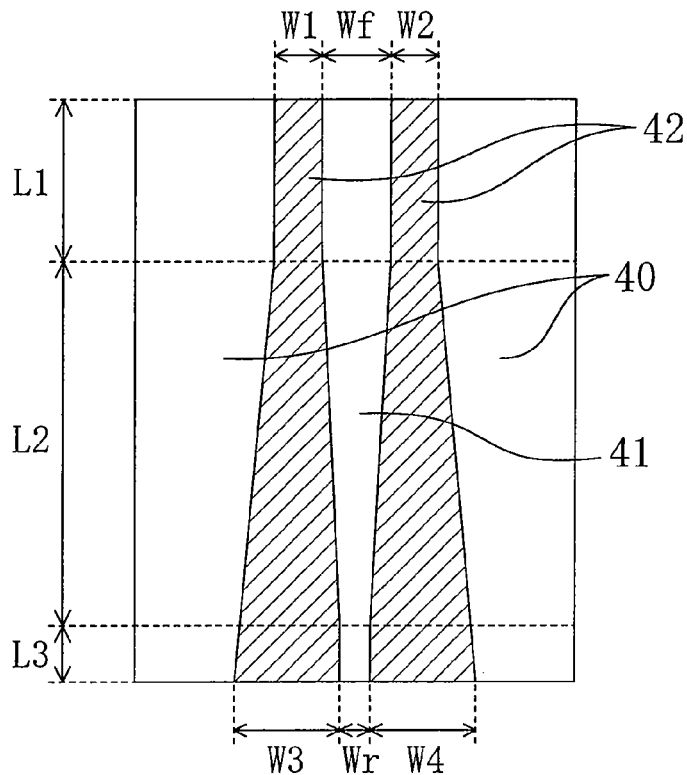
FIG. 9 is a plan view showing the respective shapes of the ridge, the trenches, and the wing regions in a semiconductor laser in an example second embodiment of the present invention.

FIG. 9 shows the respective shapes of the ridge and the wing regions in a semiconductor laser device according to an example second embodiment of the present invention. The shape of the ridge 41 is the same as that of the ridge 41 in the structure illustrated in the example first embodiment (see FIG. 2).

Each of the wing regions 40 shown in FIG. 9 has a tapered shape in which the ridge width decreases in the longitudinal direction of the resonator. To increase the distances between the center of the ridge 41 and the wing regions 40, the widths of the trenches 42 are increased. When the ridge 41 has a tapered shape, the light propagated by the waveguide leaks out from the sidewalls of the ridge 41, and the resulting scattered light spreads toward the wing regions 40. When the scattered light reaches the wing regions 40, due to the effective refractivity difference between the wing regions 40 and the trenches 42, the scattered light is reflected by the interfaces between the trenches 42 and the wing regions 40 to be reflected again toward the ridge. When the reflected light is coupled to the guided light propagated by the ridge portion, the propagation constant of the guided light changes, and the shape of the light distribution changes to cause a disturbance in the FFP pattern and a kink. In preventing this phenomenon, it is effective to increase the widths W3 and W4 between the ride 41 and the wing regions 40 at the rear end portion, and also increase the widths of the trenches 42 so as to increase the distances between the center portion of the ridge 41 and the wing regions 40 in the region where the ridge 41 has a tapered shape.

Figure 10:
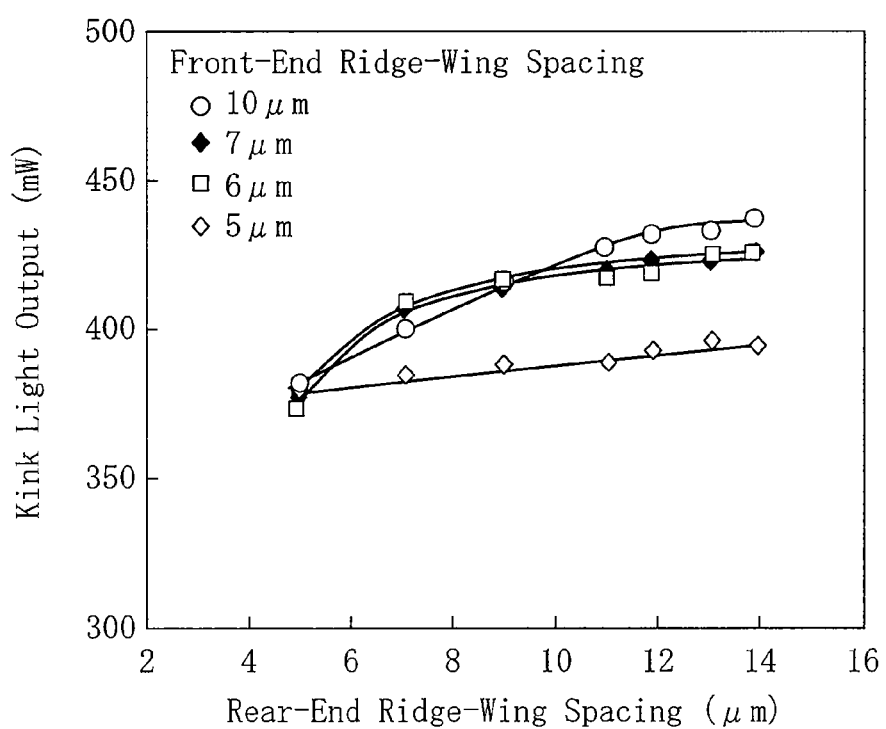
FIG. 10 is a graph showing the result of measuring the dependence of a light output at which a kink occurs in a current-light output characteristic on a rear-end ridge-wing region spacing in the example second embodiment.

FIG. 10 shows the result of measuring the light output at which a kink occurs in the current-light output characteristic when the spacings between the ridge 41 and the wing regions 40 at the rear end portion were each varied from 5 µm to 14 µm using, as parameters, the widths W1 and W2 between the ridge 41 and the wing regions 40 at the front end portion. In the measurement, the semiconductor laser element was operated at 85° C. with a pulse width of 40 ns and a duty of 33%.

From FIG. 10, it will be understood that, when the widths W3 and W4 between the ridge 41 and the wing regions 40 at the rear end portion are increased, the light output at which a kink occurs increases. In particular, it will be understood that the kink light output decreases when each of the wing regions 40 has a shape in which the distance between the center portion of the ridge 41 and the wing region 40 decreases in the region where the ridge 41 has a tapered shape. This is because, when each of the wing regions 40 has the shape in which the distance between the center portion of the ridge 41 and the wing region 40 decreases, the scattered light of the guided light in the tapered region is reflected by the interfaces between the trench portions 42 and the wing regions 40 so that the amount of the scattered light which returns to the ridge portion increases. Therefore, as shown in FIG. 9, the wing region 40 needs to have a shape in which the center portion of the ridge 41 and the wing region 40 increases.

It will be also understood that, when the widths W1 and W2 between the ridge 41 and the wing regions 40 at the front end portion are each set to a value of not less than 6 µm, and when the wing region 40 does not have the shape in which the distance between the center portion of the ridge 41 and the wing region 40 decreases, the effect of improving the kink light output is large. That is, it will be understood that, to improve the kink light output, each of the wing regions 40 may be formed appropriately such that the widths W1 and W2 are each not less than 6 µm, and W3<W1 and W4<W2 is satisfied. It will be further understood that, to improve the kink light output while preventing the deterioration of each of the polarization ratio and the temperature characteristic, the wing region 40 may be formed appropriately such that the widths W1 and W2 are each not less than 6 µm and not more than 15 µm, and W3<W1 and W4<W2 is satisfied.

It will be also understood that, when the widths W1 and W2 are each larger than 10 µm, the kink light output can be further improved by forming the wing region 40 so as to satisfy W3<W1 and W4<W2. It will be further understood that, to improve the kink light output while preventing the deterioration of each of the polarization ratio and the temperature characteristic, the wing region 40 may be formed appropriately such that the widths W1 and W2 are each not less than 10 µm and not more than 15 µm, and W3<W1 and W4<W2 is satisfied.

From the foregoing result of the experiment shown in FIG. 10, it will be understood that, to prevent a reduction in the kink light output, it is essential to set each of the widths W1 and W2 between the ridge 41 and the wing regions 40 at the front end portion to a value of not less than 6 µm, set each of the widths W3 and W4 between the ridge 41 and the wing regions 40 at the rear end portion to a value of not less than 7 µm, and further prevent each of the wing regions 40 from having a shape in which the distance between the center portion of the ridge 41 and the wing region 40 decreases. When the semiconductor laser device according to the present embodiment in which the widths W1 and W2 were each set to 7 µm, and the widths W3 and W4 were each set to 11 µm was operated at 85° C. with a pulse width of 40 ns and a duty of 33%, a kink level of not less than 400 mW was achieved.

—Variation 1—

Figure 11:
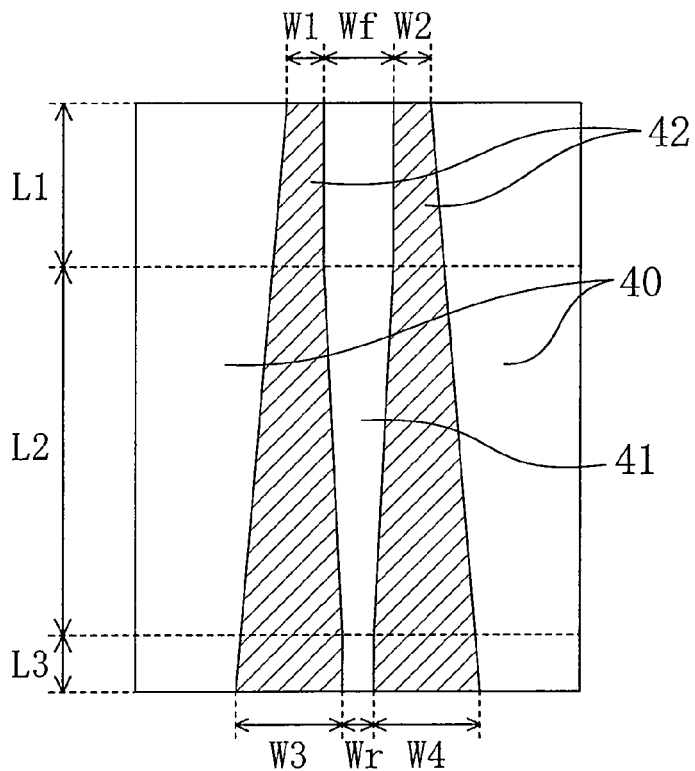
FIG. 11 is a plan view showing the respective shapes of the ridge, the trenches, and the wing regions in a semiconductor laser in a first variation of the example second embodiment.

FIG. 11 shows the ridge shape and the shapes of the wing regions in a first variation of the semiconductor laser device according to the example second embodiment. The shape of the ridge 41 is the same as that of the ridge 41 in the structure illustrated in the example first embodiment (see FIG. 2).

In the wing regions 40 shown in FIG. 11, the widths of the trenches 42 are increased so as to increase the distances between the center portion of the ridge 41 and the wing regions 40 with distance from the front end portion toward the rear end portion.

Even with such a structure, it is possible to prevent a reduction in kink light output. In the present first variation, the widths W1 and W2 are each set to 6 µm, and the widths W3 and W4 are each set to 11 µm to achieve an improvement in kink light output and the implementation of a FFP free from disturbance.

—Variation 2—

Figure 12:
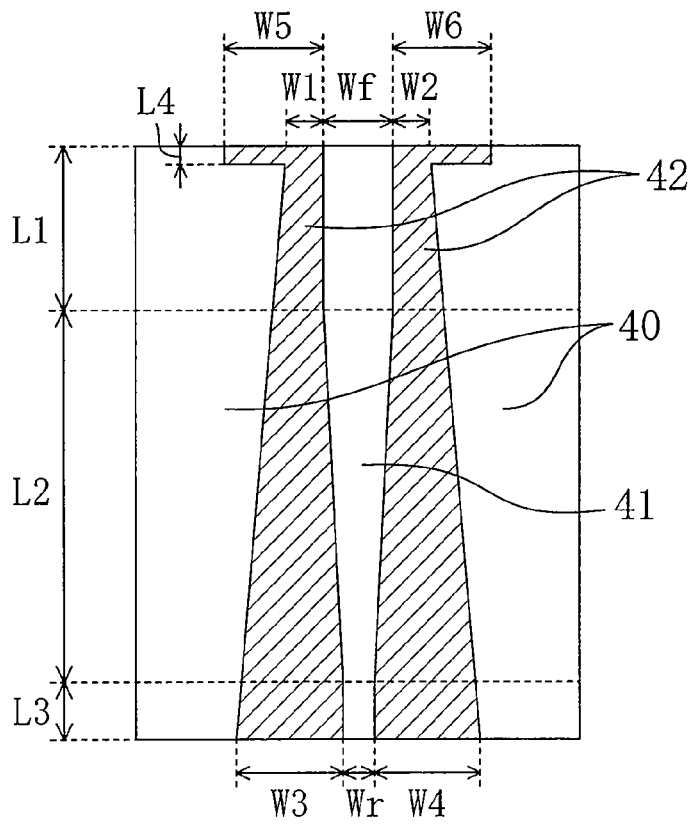
FIG. 12 is a plan view showing the respective shapes of the ridge, the trenches, and the wing region in the semiconductor laser in a second variation of the example second embodiment.

FIG. 12 shows the ridge shape and the shapes of the wing regions in a second variation of the semiconductor laser device according to the example second embodiment. The shape of the ridge 41 is the same as that of the ridge 41 in the structure illustrated in the example first embodiment (see FIG. 2). In addition, the widths W1 and W2 are each set to 6 µm, and the widths W3 and W4 are each set to 11 µm.

In the wing regions 40 shown in FIG. 12, the widths of the trenches 42 are increased so as to increase the distances between the center portion of the ridge 41 and the wing regions 40 with distance from the front end portion toward the rear end portion. However, as shown in FIG. 12, the shapes of the wing regions 40 in the vicinity of the front end portion are such that widths W5 and W6 are the same as the widths W3 and W4, respectively, in the region where the distance from the front end portion is not more than L4.

With such a structure, when the semiconductor laser element is separated by cleaving, it is possible to stably produce the wing regions 40 each having the same shape in consideration of a process variation of ±5 µm in cleaving position. In addition, by widening the wing regions 40 in the region adjacent to the end face as shown in FIG. 12, it is possible to prevent a laser beam coupled to the wing regions 40 from being reflected by the end face, returning to the guide region of the ridge, causing a disturbance in FFP, and reducing the kink light output.

The length L4 is a distance which can cover at least the range of the variations in cleaving position. When the length L4 is excessively larger, it leads to a reduction in heat emission properties so that it is necessary to set the length L4 to a distance of not less than 5 µm and not more than 30 µm. In the present third variation, the length L4 is set to 20 µm.

—Variation 3—

Figure 13:
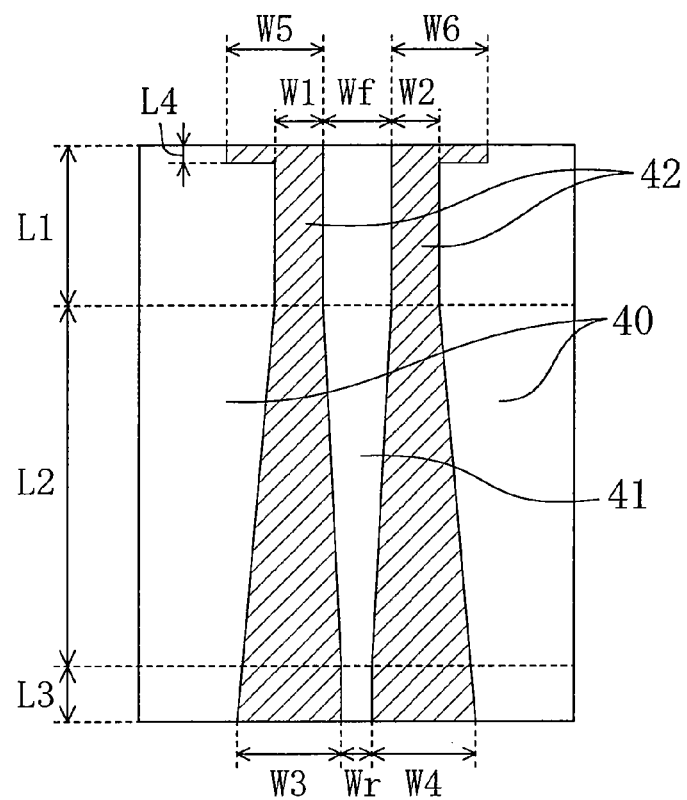
FIG. 13 is a plan view showing the respective shapes of the ridge, the trenches, and the wing regions in the semiconductor laser in a third variation of the example second embodiment.

FIG. 13 shows the ridge shape and the shapes of the wing regions in a third variation of the semiconductor laser device according to the example second embodiment. The shape of the ridge 41 and the dimensions of the widths W1 to W6 are the same as in the structure described above in the second variation. In addition, the length L4 is set to 20 µm for the reason described above.

In the present variation, the wing regions 40 are shaped to have the same size in the region where the distance from the front end face is not less than L4 and not more than L1.

In such a structure, a small amount of scattered light is generated from the sidewalls of the ridge 41 in the region where the width of the ridge 41 is constant, and the spacings between the ridge 41 and the wing regions 40 are held constant to achieve an improvement in heat emission property.

—Variation 4—

Figure 14:
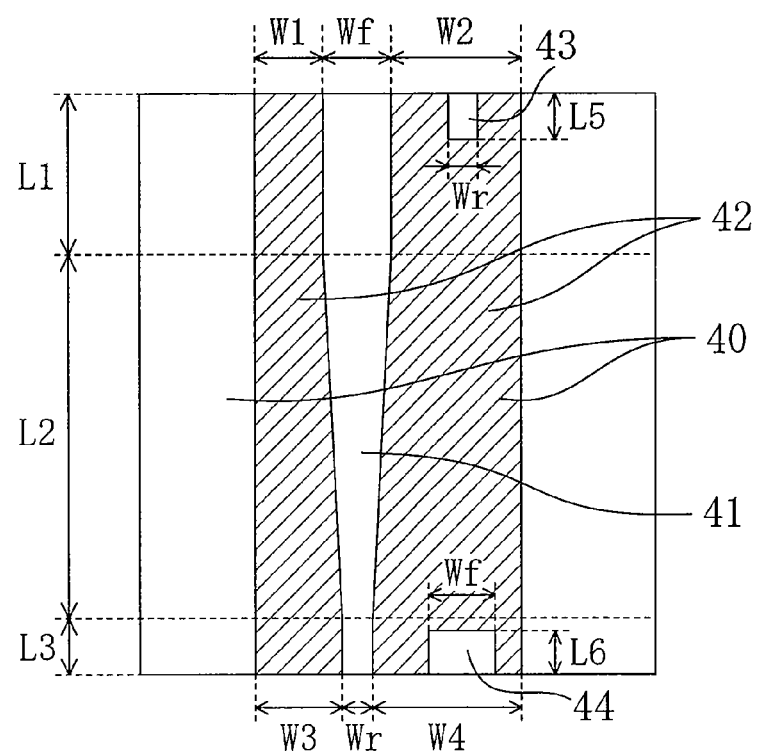
FIG. 14 is a plan view showing the respective shapes of the ridge, the trenches, and the wing regions in the semiconductor laser in a fourth variation of the example second embodiment.

FIG. 14 shows the ridge shape and the shapes of the wing regions in a fourth variation of the semiconductor laser device according to the example second embodiment. The shape of the ridge 41 is the same as that of the ridge 41 illustrated in the example first embodiment (see FIG. 2). In addition, the respective dimensional relationships between the widths W1 and W3 and between the widths W2 and W4 are also the same as in the example first embodiment.

In the present variation, the width W2 is set larger than the width W1, and a ridge 43 having a width Wr is formed in the trench having a larger width in the region with the trenches 42 adjacent to the front end portion. In the region with the trenches 42 adjacent to the rear end portion, a ridge 44 having a width Wf is formed in the trench having a larger width.

In the case where the laser element has the ridge 41 which is different in width at the front end face and the rear end face, when the ridge 41 and the element adjacent in the longitudinal direction of the resonator are formed on a straight line in a state where the element has not been separated by cleaving yet, and the cleaving position is displaced from a desired position due to the variation in cleaving position in an element cleaving step, the width of the ridge 41 may discontinuously change from the width Wf at the front end portion to the width Wr. When the width of the ridge 41 discontinuously changes, the waveguide loss abruptly increases, or the horizontal divergence angle in FFP significantly changes to increase characteristic variations during mass production, and present a serious obstacle. To prevent this, the semiconductor laser device according to the present fourth variation shown in FIG. 14 is provided with a structure in which the positions of the ridges of the elements adjacent in the longitudinal direction of the resonator are alternately discontinuous and, after cleaving, the unneeded ridges 43 and 44 formed at the front end portion and the rear end portion are each covered with a ferroelectric film made of the same material as that of a current block layer such that a current is not injected into the ridges 43 and 44, whereby a structure is implemented in which a current is injected only into the ridge 41 serving as a waveguide when laser oscillation is caused. In this case, the respective lengths L5 and L6 of the unneeded ridges 43 and 44 in the longitudinal direction of the resonator are increased to be larger than process variation in cleaving for element separation to allow elements having desired ridge shapes to be stably separated and produced by cleaving. Accordingly, the dimensions of the lengths L5 and L6 are sufficient as long as they are at least 5 µm.

In the present variation, the lengths L5 and L6 are each set to 25 µm. In addition, the widths W1 and W2 are set to 7 µm and 15 µm, respectively, to prevent a reduction in kink light output and the occurrence of a disturbance in FFP.

—Variation 5—

Figure 15:
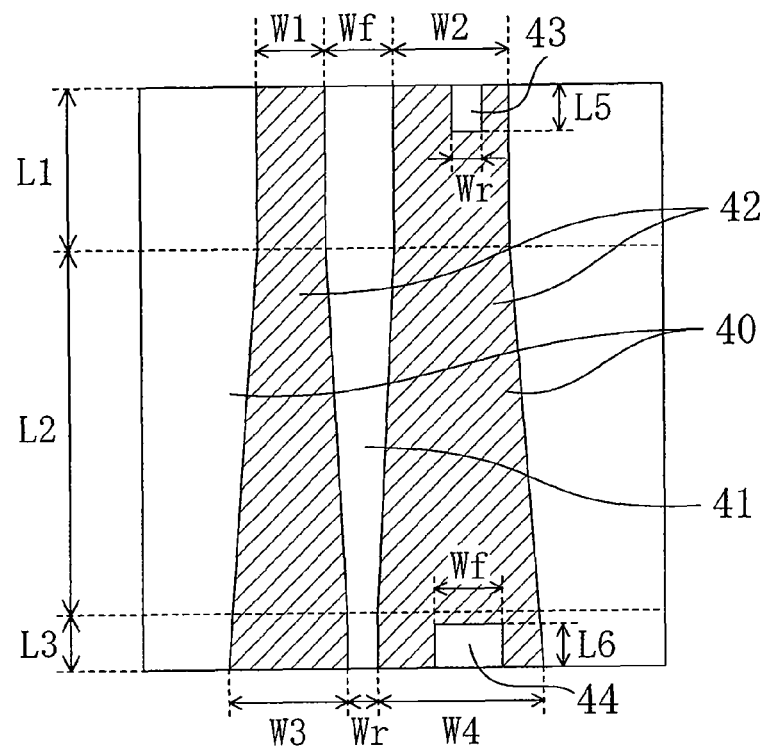
FIG. 15 is a plan view showing the respective shapes of the ridge, the trenches, and the wing regions in the semiconductor laser in a fifth variation of the example second embodiment.

FIG. 15 shows the ridge shape and the shapes of the wing regions in a fifth variation of the semiconductor laser device according to the example second embodiment. The shape of the ridge 41 is the same as that of the ridge 41 illustrated in the example first embodiment (see FIG. 2). The unneeded ridges 43 and 44 are formed for the same reason as described above in the fourth variation.

In the present variation, the wing regions 40 are such that the widths of the trenches 42 are increased so as to increase the distances between the center portion of the ridge 41 and the wing regions 40 in a tapered region where the width of the ridge 41 decreases in the longitudinal direction of the resonator.

When the ridge 41 has a tapered shape, the light propagated by the waveguide leaks out from the sidewalls of the ridge 41, and the resulting scattered light spreads toward the wing regions 40. When the scattered light reaches the wing regions 40, it is reflected by the interfaces between the trenches 42 and the wing regions 40 since there are effective refractivity differences between the wing regions 40 and the trenches 42. When the reflected light is coupled to the guided light propagated by the ridge portion, the propagation constant of the guided light changes, and the shape of the light distribution changes to cause a disturbance in the FFP pattern and a kink. In preventing this phenomenon, it is effective to increase the widths W3 and W4 between the ridge 41 and the wing regions 40 at the rear end portion, and also increase the widths of the trenches 42 so as to increase the distances between the center portion of the ridge 41 and the wing regions 40 in a region where the ridge 41 has a tapered shape.

In the present variation, the lengths L5 and L6 are each set to 25 µm. In addition, the widths W1, W2, W3, and W4 are set to 6 µm, 14 µm, 11 µm, and 19 µm, respectively, to prevent a reduction in kink light output and the occurrence of a disturbance in the FFP.

—Variation 6—

Figure 16:
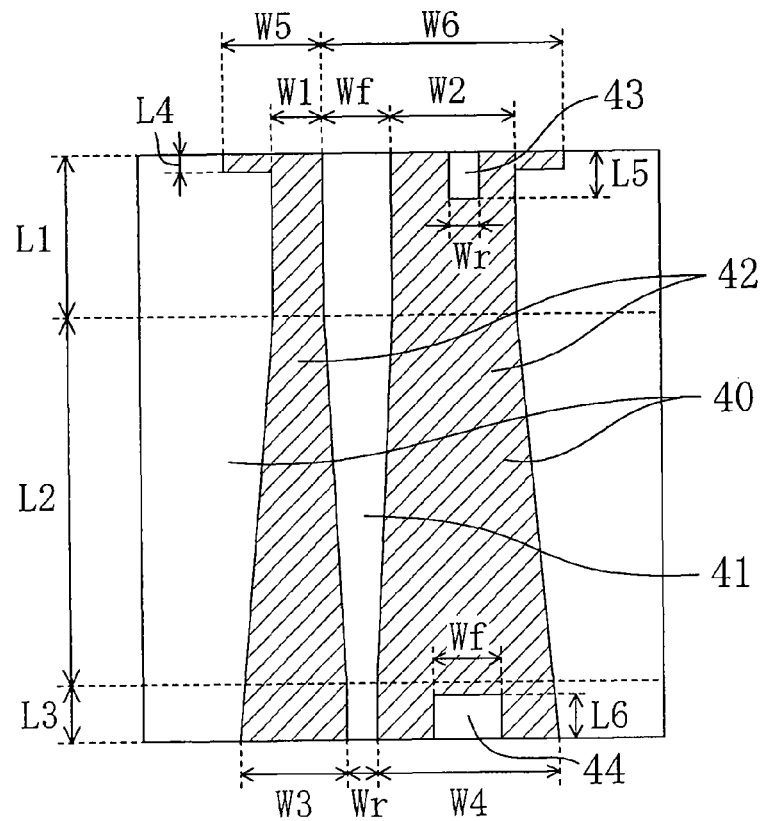
FIG. 16 is a plan view showing the respective shapes of the ridge, the trenches, and the wing regions in the semiconductor laser in a sixth variation of the example second embodiment.

FIG. 16 shows the ridge shape and the shapes of the wing regions in a sixth variation of the semiconductor laser device according to the example second embodiment. In the structure shown in FIG. 16, the respective shapes of the ridge 41 and the unneeded ridges 43 and 44, and the respective dimensions of the widths W1 to W4 are the same as in the structure of the fifth variation described above. The unneeded ridges 43 and 44 are formed for the same reason as described above in the fourth variation.

In the present variation, the wing regions 40 are such that the widths of the trenches 42 are increased with distance from the front end portion toward the rear end portion so as to increase the distances between the center of the ridge 41 and the wing regions 40. As shown in FIG. 16, the shapes of the wing regions 42 in the vicinity of the front end portion are such that the widths W5 and W6 are the same as the widths W3 and W4, respectively, in the region where the distance from the front end portion is not more than L4.

With such a structure, it is possible to stably produce the wing regions 40 each having the same shape in consideration of the magnitude of a process variation of ±5 µm in cleaving position when the semiconductor laser element is separated by cleaving. In addition, by widening the wing regions 40 in the vicinity of the end face as shown in FIG. 16, it is possible to prevent the laser light coupled to the wing regions from being reflected by the end face, returning to the guide region of the ridge portion, causing a disturbance in FFP, and reducing the kink light output.

The dimension of the length L4 is appropriate as long as it is not less than the magnitude of the variation in cleaving position. When the length L4 is excessively increased, it leads to a reduction in heat emission property. Accordingly, it is necessary to set the length L4 to a dimension of not less than 5 μm and not more than 30 μm. In the present variation, the dimension of the distance L4 is set to 20 μm.

Figure 17:
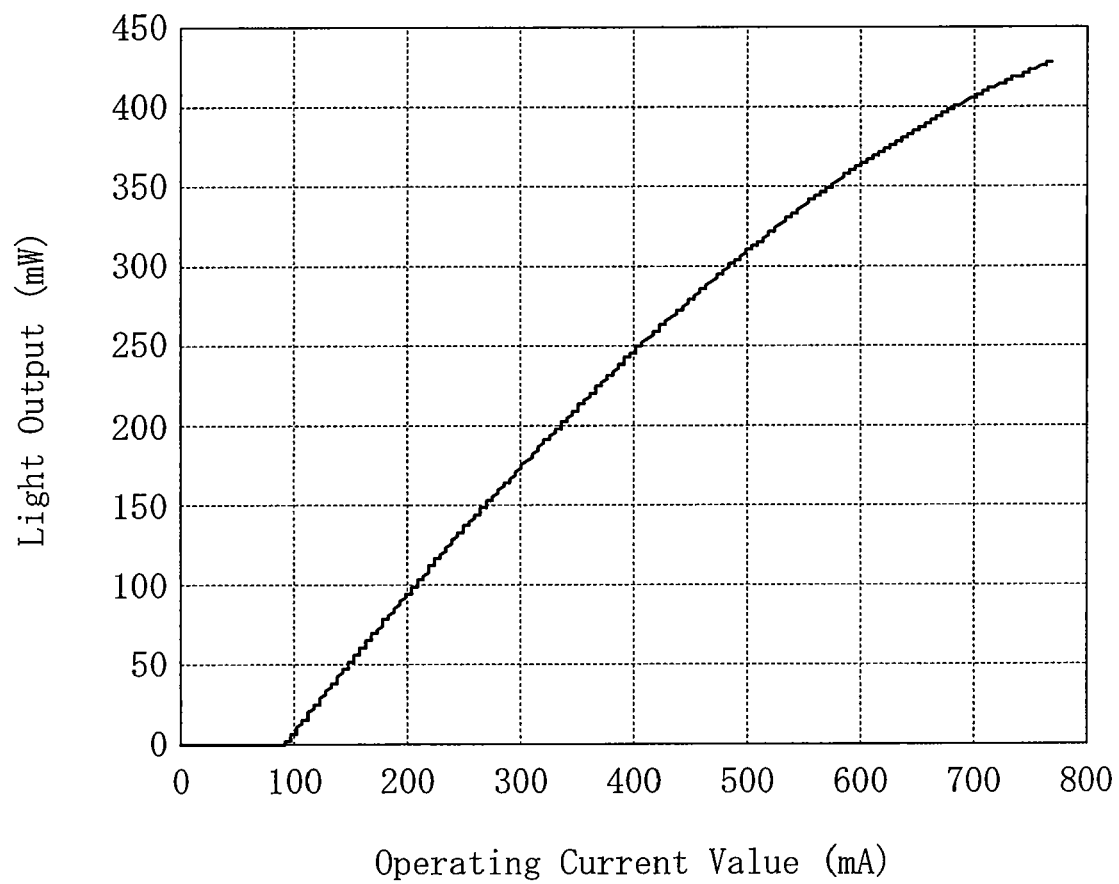
FIG. 17 is a graph showing the result of measuring a current-light output characteristic of the semiconductor laser in the sixth variation of the example second embodiment.

FIG. 17 shows the result of measuring the current-light output characteristic when the red semiconductor laser beam according to the present variation is operated at 85° C. with a pulse width of 40 ns and a duty of 33%.

From FIG. 17, it will be understood that a light output of not less than 400 mW was obtained, and an excellent current-light output characteristic in which a kink did not occur even at a light output of not less than 400 mW was obtained.

In the second embodiment described above, in the configuration having the region where the distance from the center of the ridge 41 to each of the wing regions 40 increases with distance from the front end side toward the rear end side, the tilt angle θ2 of the side surface of the wing region 40 closer to the ridge 41 with respect to the longitudinal direction of the resonator is preferably larger than the tilt angle θ1 (see FIG. 1) of the side surface of the ridge 41 with respect to the longitudinal direction of the resonator in the region where the width of the ridge 41 decreases with distance from the front end side toward the rear end side.

Embodiment 3

Figure 18:
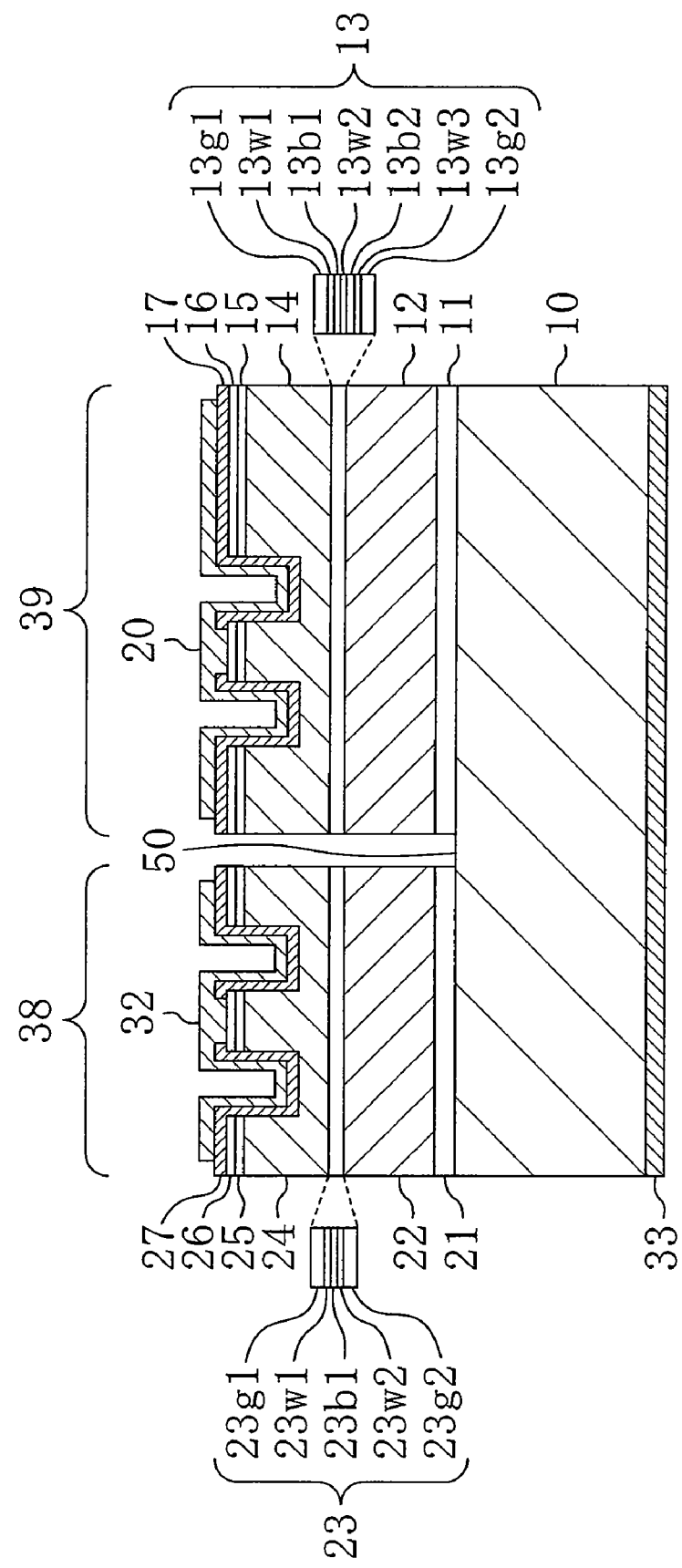
FIG. 18 is a cross-sectional view showing a dual-wavelength semiconductor laser device in an example third embodiment of the present invention.

FIG. 18 shows a cross-sectional structure of a semiconductor laser device according to an example third embodiment of the present invention.

The semiconductor laser device shown in FIG. 18 is a dual-wavelength laser including a red laser and an infrared laser. The structure of the red laser on the right-hand side of the drawing is the same as the structure illustrated with reference to FIG. 1.

The infrared laser on the left-hand side of the drawing is formed with an n-type GaAs buffer layer 21 (0.5 μm), an n-type $(Al_{0.7}Ga_{0.3})_{0.51}In_{0.49}P$ clad layer 22 (2.0 μm), a quantum well active layer 23, a p-type $(Al_{0.7}Ga_{0.3})_{0.51}In_{0.49}P$ clad layer 24, a p-type $Ga_{0.51}In_{0.49}P$ protective layer 25 ($500 \times 10^{-10}$ cm$^{-3}$), and a p-type GaAs contact layer (0.4 μm) 26. As shown in the drawing, the strained quantum well active layer 23 has a laminated structure of an AlGaAs first guide layer 23g1, a GaAs well layer 23w1, a GaAs well layer 23w2, an AlGaAs barrier layer 23b1, and an AlGaAs second guide layer 23g2. In the p-type $(Al_{0.7}Ga_{0.3})_{0.51}In_{0.49}P$ clad layer 24, the distance from the ridge upper end portion to the active layer 23 is 1.4 μm, and the distance (dp2) between the ridge lower end portion and the active layer 23 is set to 0.24 μm.

On each of the side surfaces of the ridge, a current block layer 27 made of SiN is formed, and an opening for injecting a current into the ridge portion is formed over the ridge. On the current block layer 27 and over the opening over the ridge, an electrode 32 is formed. A current for driving the infrared laser is allowed to flow via the electrode 32 and an electrode (back electrode) 33.

In this structure, the current injected from the p-type GaAs contact layer 26 is constricted only to the ridge portion by the current block layer 27, and concentratively injected into the active layer 23 located below the ridge bottom portion. As a result, an inverted population state of carries necessary for laser oscillation is implemented with a small amount of injected current on the order of several tens of milliamperes. Light emitted through the recombination of the carries injected into the active layer undergoes perpendicular light confinement in a direction perpendicular to the active layer 23 by the clad layers 22 and 24. In a direction parallel with the active layer 23, horizontal light confinement occurs because the current block layer 27 made of SiN is lower in refractivity than the clad layers 22 and 24. In addition, because the current block layer 27 is transparent with respect to laser oscillation light, there is no light absorption, and a low-loss waveguide can be implemented. The effective refractivity difference (Δn) between the inside and outside of a stripe can be precisely controlled by the order of $10^{-3}$ with the distance dp2. As a result, it is possible to obtain a high-output semiconductor laser with a low operating current, while precisely controlling a light distribution. The red laser and the infrared laser are isolated by an isolation trench region 50. The isolation trench provides electrical isolation between the red laser and the infrared laser to allow selective driving of only one of the lasers.

In the structure shown in FIG. 18, the width of the red laser portion 38 is set to 110 μm, the width of the infrared laser portion 39 is set to 90 μm, the width of the isolation region 50 is set to 30 μm, and the width of the entire element is set to 230 μm. The red laser is smaller in the band gap energy difference between the active layer 23 and the clad layers 22 and 24 than in the infrared laser. As a result, electrons injected into the active layer 23 are excited by heat, and likely to leak out into the clad layers 22 and 24 so that the red laser has an inferior temperature characteristic. Accordingly, the width of the red laser portion 38 is set larger than the width of the infrared laser 39 to improve the heat emission property of the red laser.

The length of the resonator is 1500 μm, and the front end face and the rear end face of the resonator are coated with dielectric films to have respective reflectivities of 7% and 94%.

Figure 19:
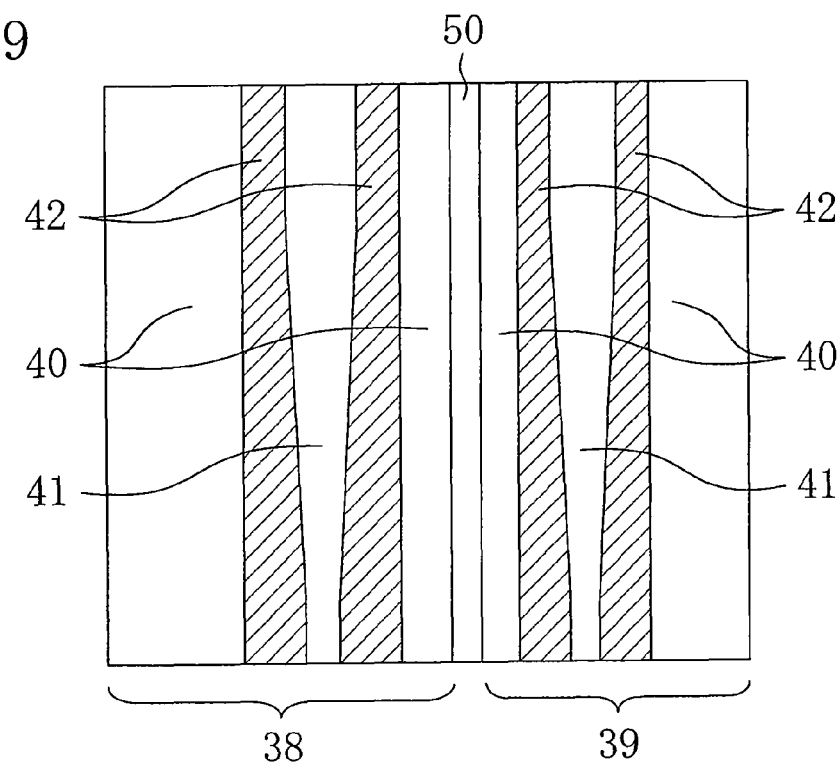
FIG. 19 is a plan view showing the respective shapes of a ridge, trenches, and wing regions in the dual-wavelength semiconductor laser in the example third embodiment.

FIG. 19 shows the ridge shape of the foregoing dual-wavelength laser shown in FIG. 18 according the example third embodiment.

As shown in FIG. 19, the red laser portion 38 and the infrared laser portion 39 are isolated by the isolation region (isolation trench) 50, and integrated on the same substrate. Each of the red laser portion 38 and the infrared laser portion 39 has the shape of the ridge 41, the shapes of the trenches 42, and the shapes of the wing regions 40 described above in the first embodiment. The width Wf of the ridge 41 of the front end portion is set to 3.5 μm and 4.5 μm for the red laser portion 38 and the infrared laser portion 39, respectively. The width Wr of the ridge 41 of the rear end portion is set to 1.6 μm for each of the red laser portion 38 and the infrared laser portion 39 to suppress a high-order transverse mode oscillation operation.

In this structure, the widths of the trenches 42 on both sides of the ridge 41 on the front end side are each set to 7 μm and 6 μm for the red laser portion 38 and the infrared laser portion 39, respectively, such that the widths of the trenches 42 of the red laser portion 38 on the front end side are smaller than those of the red laser portion 38. This is because, when the dual-wavelength laser is used as a light source for an optical disk, and an optical pick-up is constructed using the same optical system, the usage rate of red laser light having a temperature characteristic inferior to that of infrared laser light needs to be set higher than that of the infrared laser light in association with the efficiency of light intake to a lens. Accordingly, the horizontal half width of the FFP of the red laser portion 38 needs to be set to a value in the range of 9° to 10° to be larger than the horizontal half width of the FFP of the infrared laser portion 39. According, in the present embodiment, the width Wf of the ridge 41 at the front end portion is set to 3.5 μm and 4.5 μm for the red laser portion 38 and the infrared laser portion 39, respectively, such that the stripe width at the front end face of the red laser portion 38 is smaller than that of the infrared laser portion 39. In this case, unless the widths of the trenches 42 on both sides of the ridge 41 on the front end side are set smaller for the infrared laser portion 39 than for the red laser portion 38, the width of the entire dual-wavelength laser element consequently increases to increase element production cost. Moreover, because the size of a bit on a DVD optical disk is smaller than that of a bit on a CD optical disk, when the laser light is converged to the diffraction limited, the influence of a disturbance in FFP becomes larger in the red laser portion 38. Therefore, to possibly minimize the area of the entire element in the dual-wavelength laser according to the present embodiment, the widths of the trenches 42 on both sides of the ridge 41 on the front end side are set such that the widths of the trenches 42 on the front end side of the infrared laser portion 39 are smaller than the widths of the trenches 42 on the front end side of the red laser portion 38.

In addition, as shown in FIG. 19, the wing regions 40 have linear shapes. With the arrangement, it is possible to obtain a dual-wavelength semiconductor laser device having an excellent high-temperature operation property, a high kink light output, a FFP free from disturbance, and a high polarization ratio.

—Variation—

Figure 20:
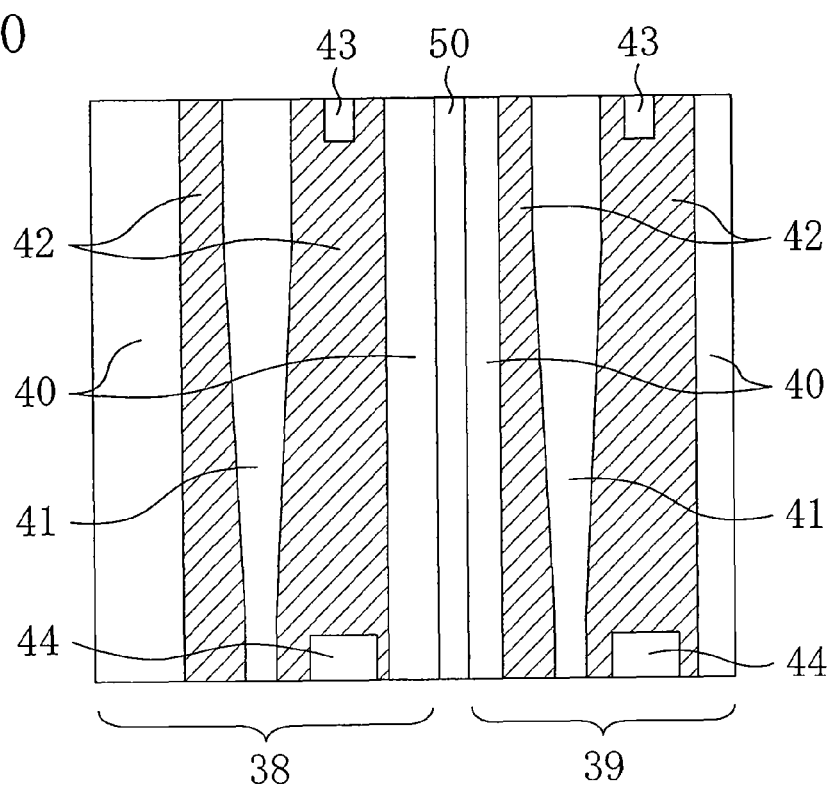
FIG. 20 is a plan view showing the shapes of the ridge, the trenches, and the wing regions in the dual-wavelength semiconductor laser in a variation of the example third embodiment.
Figure 21:
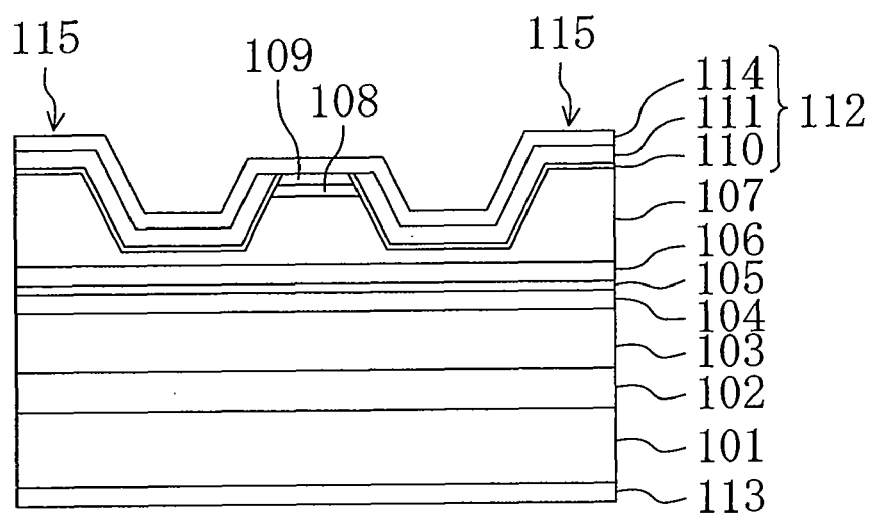
FIG. 21 is a cross-sectional view showing a conventional semiconductor laser device.
Figure 22:
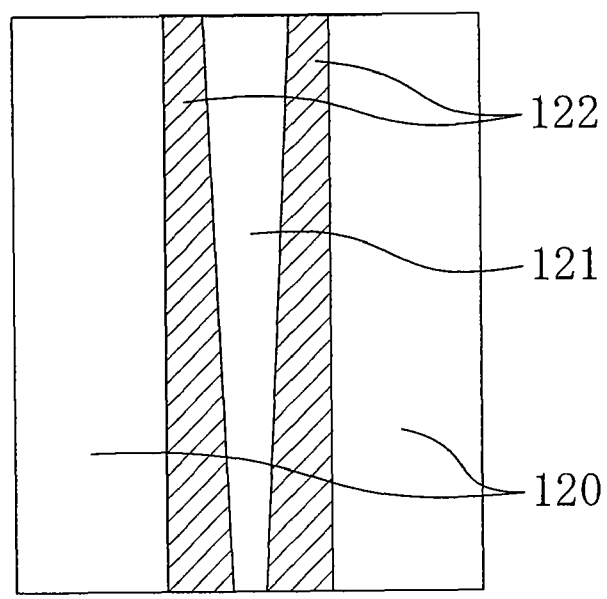
FIG. 22 is a plan view showing the shapes of a ridge, trenches, and wing regions in the conventional semiconductor laser.
Figure 23:
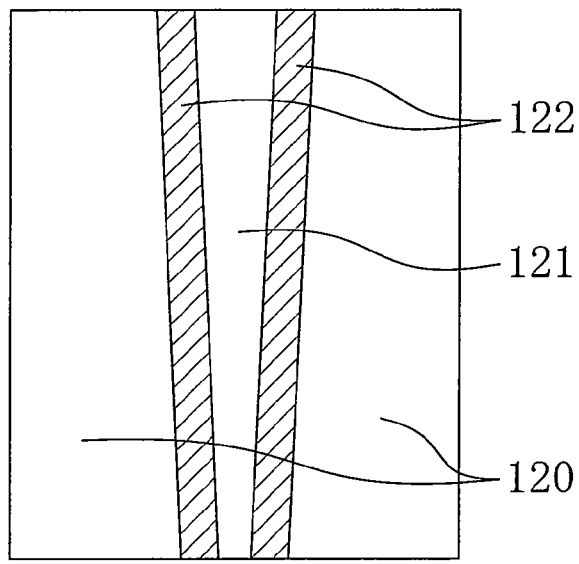
FIG. 23 is a plan view showing the shapes of a ridge, trenches, and wing regions in another conventional semiconductor laser.
Figure 24:
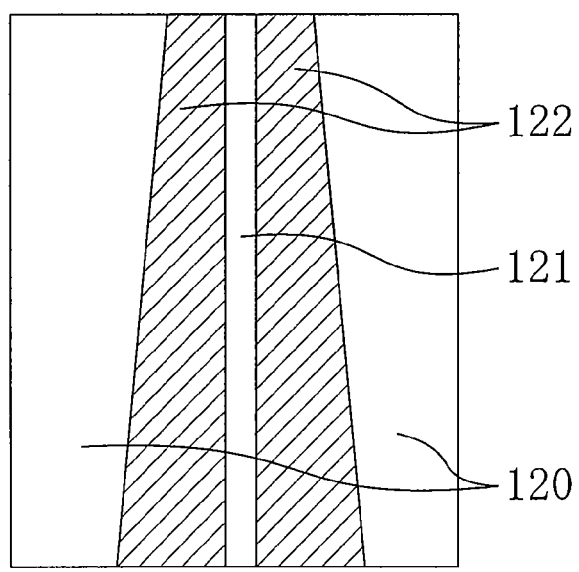
FIG. 24 is a plan view showing the shapes of a ridge, trenches, and wing regions in still another conventional semiconductor laser.

FIG. 20 shows a ridge shape in a variation of the dual-wavelength laser according to the example third embodiment.

In the present variation, each of the red laser portion 38 and the infrared laser portion 39 has the shape of the ridge 41, the shapes of the trenches 42, and the shapes of the wing regions 40 described above in the fifth variation of the second embodiment. The width Wf of the ridge 41 at the front end portion is set to 3.5 μm and 4.5 μm for the red laser portion 38 and the infrared laser portion 39, respectively. The width Wr of the ridge 41 at the rear end portion is set to 1.6 μm for each of the red laser portion 38 and the infrared laser portion 39 to suppress the high-order transverse mode operation.

In the present variation, the widths W1 and W2 of the trenches 42 on the front end side are set to 7 μm and 15 μm for each of the red laser portion 38 and the infrared laser portion 39 to prevent a reduction in kink light output and the occurrence of a disturbance in FFP.

In the third embodiment described above, in the configuration having the region where the distance from the center of the ridge 41 to each of the wing regions 40 increases with distance from the front end side toward the rear end side, the tilt angle θ2 of the side surface of the wing region 40 closer to the ridge 41 with respect to the longitudinal direction of the resonator is preferably larger than the tilt angle θ1 (see FIG. 1) of the side surface of the ridge 41 with respect to the longitudinal direction of the resonator in the region where the width of the ridge 41 decreases with distance from the front end side toward the rear end side.

Thus, by integrating the red laser and the infrared laser each having the shape of the ridge, the shapes of the trenches, and the shapes of the wing regions described in each of the example first to third embodiments and the variations of the present invention, it is possible to obtain a dual-wavelength semiconductor laser device having an excellent high-temperature operation property, a high kink light output, a FFP free from disturbance, and a high polarization ratio.

Although the description has been given heretofore using the red laser and the infrared laser as examples, the present invention is also applicable to a semiconductor laser which is made of a nitride material, and emits light in the blue to ultraviolet range.

Since the semiconductor laser device shown in each of the example embodiments of the present invention can implement a semiconductor laser capable of a high-temperature and high-output operation, and having a high kink light output, a FFP free from disturbance, and a high polarization ratio, it is useful when applied to an optical disk device for recording, such as DVD or CD.

What is claimed is:

1. A semiconductor laser device comprising:
   an n-type clad layer formed on a substrate;
   an active layer formed on the n-type clad layer; and
   a p-type clad layer formed on the active layer to have a striped ridge and wing regions, the wing regions being provided with a first trench present on one side of the ridge and a second trench present on the other side thereof being interposed therebetween, wherein
   a reflectivity Rf at a front end face as a light extraction side of a resonator, a reflectivity Rr at a rear end face of the resonator, a minimum value W1 of a width of the first trench in a region adjacent to the front end face, a minimum value W2 of a width of the second trench in the region adjacent to the front end face, a width W3 of the first trench at the rear end face, and a width W4 of the second trench at the rear end face satisfy:

$Rf<Rr, W1<W3,$ and $W2<W4,$ a width Wf of the ridge at the front end face, and a width Wr of the ridge at the rear end face satisfy:

$Wf>Wr,$ and the ridge includes a region where a width decreases with distance from the front end side toward the rear end side.

2. The semiconductor laser device of claim 1, wherein a distance from a center of the ridge on the front end side to each of the wing regions on the front end side is smaller than a distance from the center of the ridge on the rear end side to each of the wing regions on the rear end side.

3. The semiconductor laser device of claim 2, wherein the distance from the center of the ridge to each of the wing regions includes a portion where a width is constant between the front end side and the rear end side, and a portion where a width increases with distance from the front end side toward the rear end side.

4. The semiconductor laser device of claim 3, wherein, in a region where the width of the ridge decreases with distance from the front end side toward the rear end side, the distance from the center of the ridge to the wing region widthwise increases with distance from the front end side toward the rear end side.

5. The semiconductor laser device of claim 4, wherein,
   in the region where the width of the ridge decreases with distance from the front end side toward the rear end side, a tilt angle θ1 of a side surface of the ridge with respect to a longitudinal direction of the resonator is not more than 0.3°, and,
   in a region where the distance from the center of the ridge to the wing region increases with distance from the front end side toward the rear end side, a tilt angle θ2 of a side surface of the wing region closer to the ridge with respect to the longitudinal direction of the resonator is larger than the angle θ1.

6. The semiconductor laser device of claim 1, wherein the width W1 of the first trench and the width W2 of the second trench on the front end side are each not less than 6 μm, and not more than 15 μm.

7. The semiconductor laser device of claim 6, wherein the width W3 of the first trench and the width W4 of the second trench on the rear end side are each not less than 7 μm, and the width W3 of the first trench on the rear end side is larger than the width W1 of the first trench on the front end side, and the width W4 of the second trench on the rear end side is larger than the width W2 of the second trench on the front end side.

8. A dual-wavelength semiconductor laser device comprising a red laser and an infrared laser each integrated on a single substrate, wherein
each of the red laser and the infrared laser has a structure of the semiconductor laser device of claim 1.

9. A semiconductor laser device comprising:
an n-type clad layer formed on a substrate;
an active layer formed on the n-type clad layer; and
a p-type clad layer formed on the active layer to have a striped ridge and wing regions, the wing regions being provided with a first trench present on one side of the ridge and a second trench present on the other side thereof being interposed therebetween, wherein
a reflectivity Rf at a front end face as a light extraction side of a resonator, a reflectivity Rr at a rear end face of the resonator, a width W1 of the first trench at the front end face, a width W2 of the second trench at the front end face, a width W3 of the first trench at the rear end face, and a width W4 of the second trench at the rear end face satisfy:

Rf<Rr, W1<W3, and W2<W4, a width Wf of the ridge at the front end face, and a width Wr of the ridge at the rear end face satisfy:

Wf>Wr, and the ridge includes a region where a width decreases with distance from the front end side toward the rear end side.

10. The semiconductor laser device of claim 9, wherein a distance from a center of the ridge on the front end side to each of the wing regions on the front end side is smaller than a distance from the center of the ridge on the rear end side to each of the wing regions on the rear end side.

11. The semiconductor laser device of claim 10, wherein the distance from the center of the ridge to each of the wing regions includes a portion where a width is constant between the front end side and the rear end side, and a portion where a width increases with distance from the front end side toward the rear end side.

12. The semiconductor laser device of claim 11, wherein, in a region where the width of the ridge decreases with distance from the front end side toward the rear end side, the distance from the center of the ridge to the wing region widthwise increases with distance from the front end side toward the rear end side.

13. The semiconductor laser device of claim 12, wherein,
in the region where the width of the ridge decreases with distance from the front end side toward the rear end side, a tilt angle θ1 of a side surface of the ridge with respect to a longitudinal direction of the resonator is not more than 0.3°, and,
in a region where the distance from the center of the ridge to the wing region increases with distance from the front end side toward the rear end side, a tilt angle θ2 of a side surface of the wing region closer to the ridge with respect to the longitudinal direction of the resonator is larger than the angle θ1.

14. The semiconductor laser device of claim 9, wherein the width W1 of the first trench and the width W2 of the second trench on the front end side are each not less than 6 μm, and not more than 15 μm.

15. The semiconductor laser device of claim 14, wherein the width W3 of the first trench and the width W4 of the second trench on the rear end side are each not less than 7 μm, and
the width W3 of the first trench on the rear end side is larger than the width W1 of the first trench on the front end side, and the width W4 of the second trench on the rear end side is larger than the width W2 of the second trench on the front end side.

16. A dual-wavelength semiconductor laser device comprising a red laser and an infrared laser each integrated on a single substrate, wherein
each of the red laser and the infrared laser has a structure of the semiconductor laser device of claim 9.

* * * * *